United States Patent
Wells et al.

(10) Patent No.: US 9,900,983 B2
(45) Date of Patent: Feb. 20, 2018

(54) MODULAR PRINTED CIRCUIT BOARD ELECTRICAL INTEGRITY AND USES

(71) Applicant: INTEL CORPORATION, Santa Clara, CA (US)

(72) Inventors: Kevin E. Wells, Placerville, CA (US); Richard C. Stamey, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/045,024

(22) Filed: Feb. 16, 2016

(65) Prior Publication Data
US 2016/0165724 A1    Jun. 9, 2016

Related U.S. Application Data

(63) Continuation-in-part of application No. 14/496,876, filed on Sep. 25, 2014.
(Continued)

(51) Int. Cl.
*H05K 1/11* (2006.01)
*H05K 7/02* (2006.01)
(Continued)

(52) U.S. Cl.
CPC .............. *H05K 1/115* (2013.01); *G06F 1/16* (2013.01); *G06F 1/18* (2013.01); *G06F 1/183* (2013.01);
(Continued)

(58) Field of Classification Search
CPC ...... H05K 1/115; H05K 7/023; H05K 1/0216; H05K 3/36; H05K 3/421; G06F 1/16
(Continued)

(56) References Cited

U.S. PATENT DOCUMENTS 3,868,770 A    3/1975    Davis et al.
4,391,909 A    7/1983    Lim
(Continued)

FOREIGN PATENT DOCUMENTS

CN    201409148 Y    2/2010
CN    201409148 YH    2/2010
(Continued)

OTHER PUBLICATIONS

Office Action dated May 26, 2016 for U.S. Appl. No. 14/496,876, 19 pages.
(Continued)

*Primary Examiner* — Timothy Thompson
*Assistant Examiner* — Charles Pizzuto
(74) *Attorney, Agent, or Firm* — Schwabe, Williamson & Wyatt, P.C.

(57) ABSTRACT

Modular printed circuit board (PCB) structures and methods of producing them are described herein. In some embodiments, a PCB structure may include a first PCB module including first structures on one or more layers of the first PCB module. The PCB structure may further include a second PCB module including second structures on one or more layers of the second PCB module. The PCB structure may additionally include a middle layer between the first PCB module and the second PCB module. The middle layer electrically coupling, without connectors, one or more of the first structures aligned with one or more of the second structures.

35 Claims, 15 Drawing Sheets

Related U.S. Application Data

(60) Provisional application No. 62/013,808, filed on Jun. 18, 2014.

(51) Int. Cl.

| | | |
|---|---|---|
| *H05K 1/02* | (2006.01) | |
| *H05K 3/36* | (2006.01) | |
| *H05K 3/42* | (2006.01) | |
| *G06F 1/16* | (2006.01) | |
| *H05K 3/34* | (2006.01) | |
| *H05K 1/14* | (2006.01) | |
| *G06F 1/18* | (2006.01) | |
| *H01L 23/498* | (2006.01) | |

(52) U.S. Cl.
CPC ....... *H01L 23/49833* (2013.01); *H05K 1/141* (2013.01); *H05K 3/3436* (2013.01); *H05K 3/421* (2013.01); *H01L 2924/0002* (2013.01); *H05K 2201/041* (2013.01); *H05K 2201/10719* (2013.01); *Y02P 70/613* (2015.11); *Y10T 29/49128* (2015.01)

(58) Field of Classification Search
USPC .............................. 361/679.31, 735; 29/830
See application file for complete search history.

(56) References Cited

U.S. PATENT DOCUMENTS

| | | | |
|---|---|---|---|
| 4,392,909 A * | 7/1983 | Bohn ..................... B30B 15/34 |
| | | | 100/137 |
| 5,783,870 A | 7/1998 | Mostafazadeh et al. | |
| 6,101,100 A | 8/2000 | Londa | |
| 6,195,268 B1 | 2/2001 | Eide | |
| 6,414,850 B1 | 7/2002 | Kozak et al. | |
| 7,019,221 B1 | 3/2006 | Noda | |
| 7,609,527 B2 * | 10/2009 | Tuominen ........... H01L 23/5389 |
| | | | 361/760 |
| 8,018,738 B2 | 9/2011 | Doblar et al. | |
| 8,174,106 B2 | 5/2012 | Coleus et al. | |
| 8,446,738 B2 | 5/2013 | Colbert et al. | |
| 8,872,333 B2 | 10/2014 | Lopez et al. | |
| 9,545,018 B2 * | 1/2017 | Kuo ..................... H05K 3/4602 |
| 2003/0193793 A1 | 10/2003 | Dent | |
| 2006/0055017 A1 | 3/2006 | Cho et al. | |
| 2006/0250308 A1 * | 11/2006 | Pinel .................. H01P 1/20327 |
| | | | 343/700 MS |
| 2008/0043441 A1 | 2/2008 | Tuominen et al. | |
| 2009/0243115 A1 * | 10/2009 | Lee .......................... G11C 5/02 |
| | | | 257/773 |
| 2011/0207866 A1 * | 8/2011 | Japp ..................... H01L 23/145 |
| | | | 524/361 |
| 2012/0206231 A1 | 8/2012 | Kojima et al. | |
| 2014/0111951 A1 | 4/2014 | Standing et al. | |
| 2015/0036305 A1 | 2/2015 | Nanjo | |

FOREIGN PATENT DOCUMENTS

| | | |
|---|---|---|
| CN | 203535549 U | 4/2014 |
| CN | 203535549 UH | 4/2014 |
| JP | 11067040 A | 3/1999 |
| JP | 11067040 A1 | 3/1999 |
| JP | 2010-245288 A | 10/2010 |
| JP | 2014-060202 A | 4/2014 |

OTHER PUBLICATIONS

International Search Report and Written Opinion dated Aug. 21, 2015 for International Application No. PCT/US2015/029929, 13 pages.

International Search Report and Written Opinion dated Apr. 28, 2017 for International Application No. PCT/US2017/013780, 14 pages.

* cited by examiner

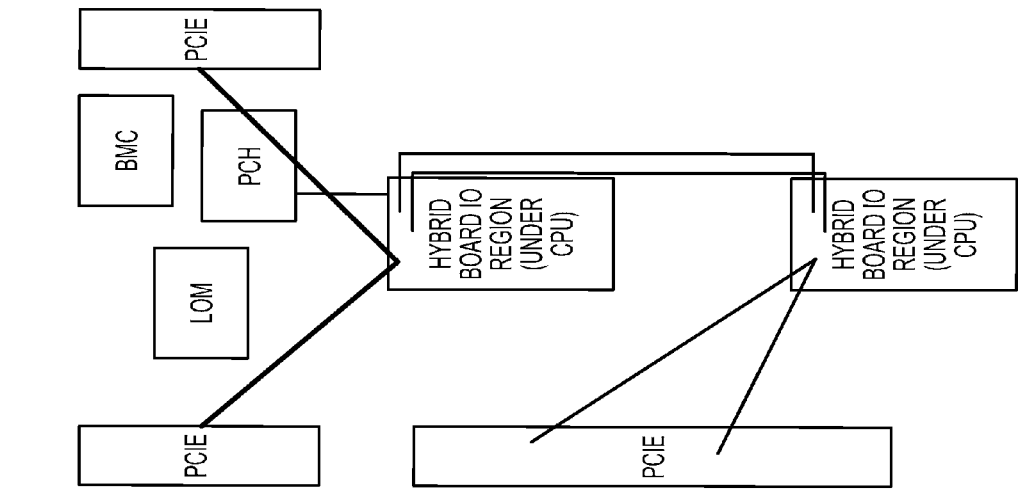
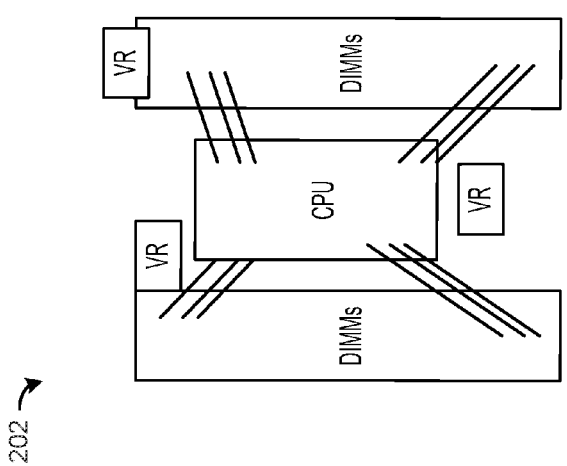
Fig. 2

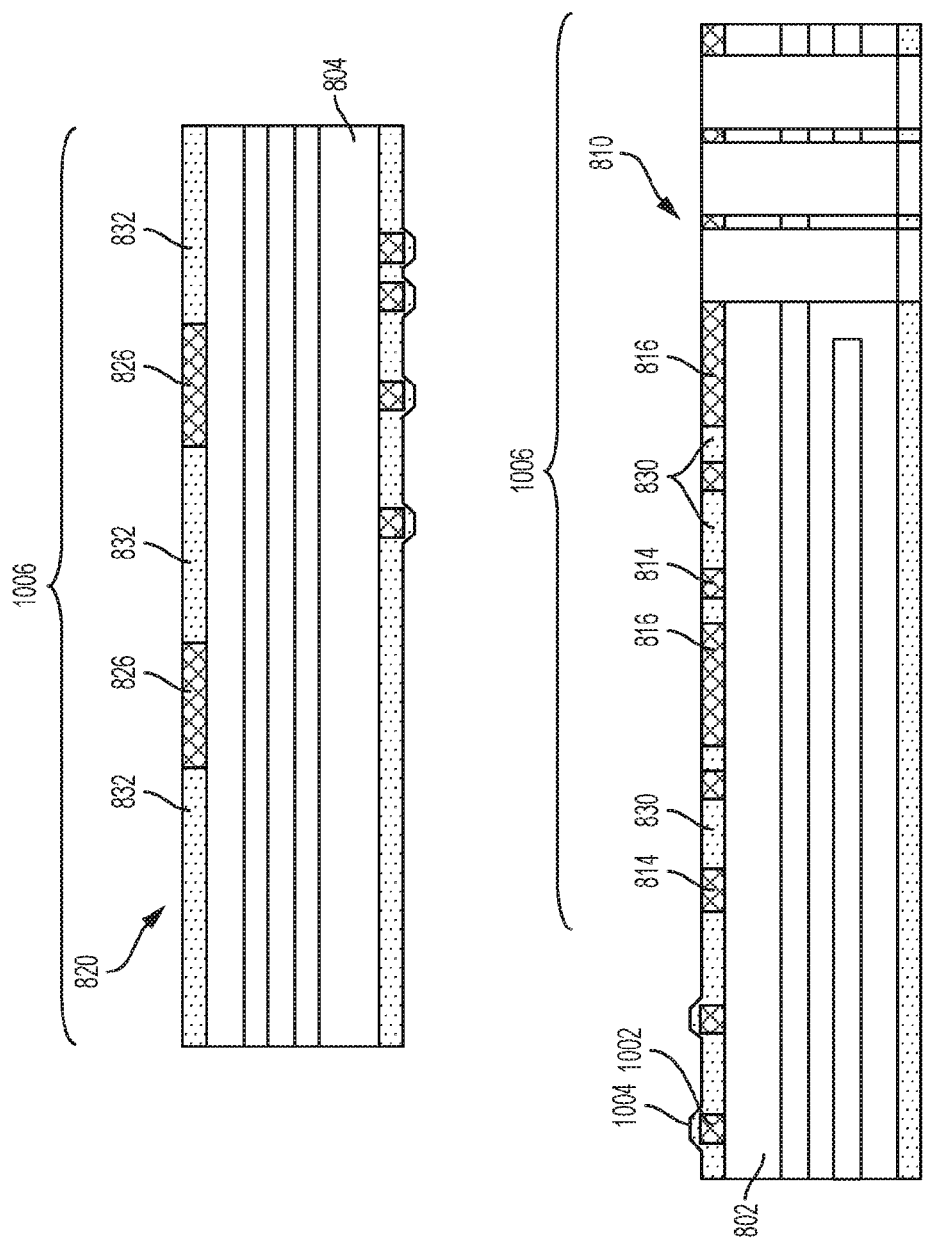

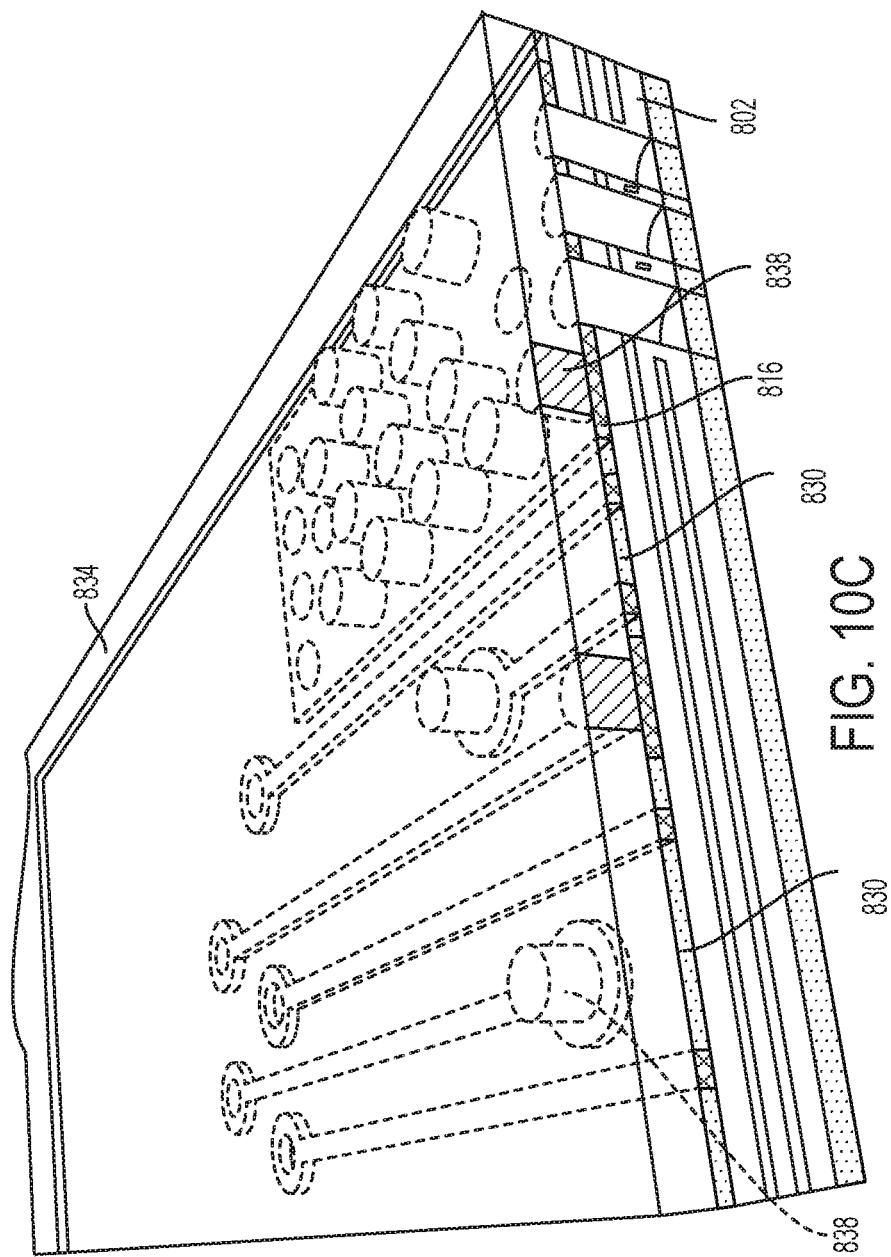

MODULAR PRINTED CIRCUIT BOARD ELECTRICAL INTEGRITY AND USES

RELATED APPLICATIONS

The present application is a continuation-in-part (CIP) of U.S. patent application Ser. No. 14/496,876 filed Sep. 25, 2014, entitled "Modular Printed Circuit Board," which claims the benefit of U.S. Provisional Patent Application No. 62/013,808 filed Jun. 18, 2014, entitled "Technologies for Accelerating Printed Circuit Board Manufacturing," the contents of which are incorporated herein by reference in their entirety.

FIELD OF THE INVENTION

The present disclosure relates generally to the technical field of computing, and more particularly, to modular printed circuit boards and methods for making and/or using them.

BACKGROUND

The background description provided herein is for the purpose of generally presenting the context of the disclosure. Unless otherwise indicated herein, the materials described in this section are not prior art to the claims in this application and are not admitted to be prior art or suggestions of the prior art, by inclusion in this section.

A printed circuit board (PCB) may provide a non-conductive substrate to mechanically support and electrically connect electronic components or structures fabricated and/or secured on the PCB using, for example, conductive vias, tracks, pads, or other routing features. As the complexity of circuits has increased over the years, more complex PCBs have emerged. For example, to accommodate complex circuit design, PCBs may include multiple layers of interconnects (e.g., traces) and various vias interconnecting the various layers. Advanced PCBs may also contain capacitors, resistors, or active devices embedded in the substrate. As the complexity and design type of PCBs increase, the overall cost of the electronic components has also increased. Even with multiple layers containing complex components, a single PCB may be insufficient for certain computing needs.

BRIEF DESCRIPTION OF THE DRAWINGS

Embodiments will be readily understood by the following detailed description in conjunction with the accompanying drawings. The concepts described herein are illustrated by way of example and not by way of limitation in the accompanying figures. For simplicity and clarity of illustration, elements illustrated in the figures are not necessarily drawn to scale. Where considered appropriate, like reference labels designate corresponding or analogous elements.

FIG. 2 is a schematic block diagram illustrating an example computing device incorporating aspects of the present disclosure, in accordance with various embodiments;

FIGS. 10A-10C depict cross-sectional or perspective views of example portions of the modular PCB of FIG. 8 during fabrication, according to some embodiments;

DETAILED DESCRIPTION

Figure 1:
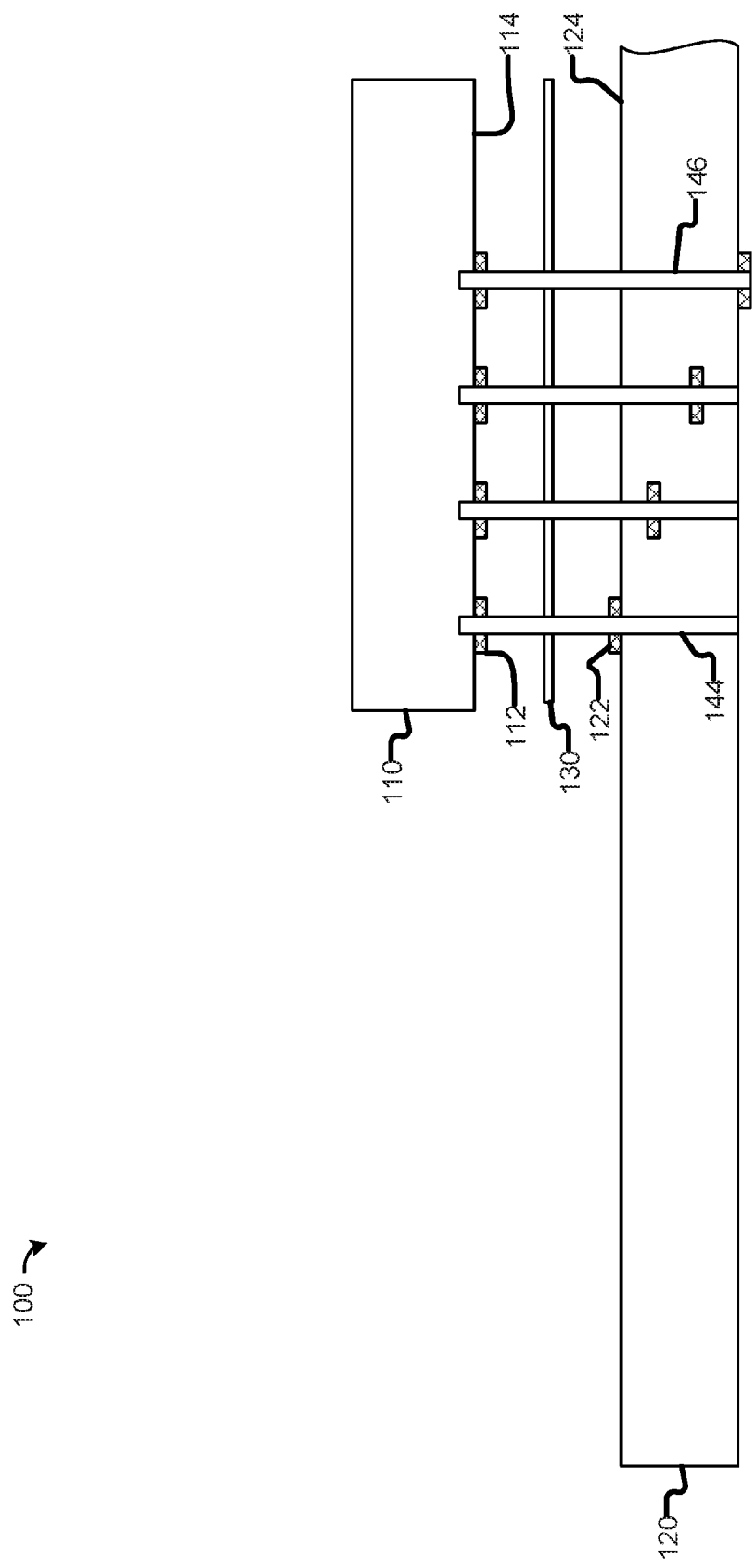
FIG. 1 is a schematic cross-sectional view illustrating an example modular PCB incorporating aspects of the present disclosure, in accordance with various embodiments.

Embodiments of apparatuses and methods related to modular printed circuit boards (PCB) are described. In embodiments, a PCB structure may include a first PCB module including first structures on one or more layers of the first PCB module. The PCB structure may further include a second PCB module including second structures on one or more layers of the second PCB module. The PCB structure may further include a middle layer, in between the first PCB module and the second PCB module, electrically coupling, without connectors, one or more of the first structures aligned with one or more of the second structures and electrically isolating one or more of the first structures from adjacent structures. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

Referring now to FIG. 1, a schematic cross-sectional view illustrating example modular PCB 100 incorporating aspects of the present disclosure is shown, in accordance with various embodiments. Modular PCB 100 may include PCB module 110 and PCB module 120. In some embodiments, PCB module 110 may include one or more processors and memory, and PCB module 120 may include various input/output (IO) components or a baseboard management controller (BMC).

In various embodiments, PCB modules 110 and 120 may be bonded to each other based on bonding layer 130. In various embodiments, PCB module 110 may be fabricated separately from PCB module 120 before they are bonded together. In some embodiments, bonding layer 130 may include pre-impregnated composite fibers (pre-preg) with epoxy resin, where the fibers and the epoxy resin may form a weave to bond adjacent materials together.

In some embodiments, PCB module 110 may share a common via pad pattern with PCB module 120. As an example, pad 112 and pad 122 may form a corresponding via pad pair. In a post lamination process, PCB module 110 may be aligned with PCB module 120 based at least in part on at least one mass lamination registration hole (not shown). Then, bonding layer 130 may mechanically bond the two PCB modules. Further, one or more vias may be drilled and plated to electrically couple the two PCB modules, e.g., through their common pad pairs. In various embodiments, bonding layer 130 may be only partially cured, and the PCB modules and bonding layer 130 may be placed in an oven or autoclave to allow bonding layer 130 to be cured when heat accelerates its polymerization process.

In various embodiments, the outermost layer 114 of PCB module 110 may have a smaller surface area than the outmost layer 124 of PCB module 120. Therefore, modular PCB 100 may have at least two regions with different heights. For example, the combined height of PCB module 110 and PCB module 120 is greater than PCB module 120 alone. In various embodiments, although PCB module 110 may have a smaller footprint, PCB module 110 may be more difficult or costly to manufacture for various reasons, such as it may include a greater signal routing density or have a higher layer count. As an example, when PCB module 110 hosts processors and memory together, it may include a six-layer profile. In some embodiments, PCB module 110 may host one or more processors. In other embodiments, various processors may be separately situated in multiple PCB modules, which may be all secured to PCB module 120.

PCB module 120 may be fabricated partially separately from PCB module 110, and may be manufactured with less complexity, as it may include less dense signal routing and a lower layer count. Accordingly, PCB module 110 and PCB module 120 may use different PCB materials that are suitable for the signals routed on the respective module. As an example, PCB module 110 may utilize PCB materials more suitable for higher signal routing density, higher power density, or higher layer count compared to what may be used for PCB module 120.

In various embodiments, PCB module 110 may include a first PCB material with a first loss factor; and PCB module 120 may include a second PCB material with a second loss factor that is lower than the first loss factor. In some embodiments, PCB module 120 may contain high-speed IO connectors, a platform controller hub (PCH), a BMC, voltage regulators (VR), sensors, or power connectors. In some embodiments, PCB module 120 with IO connectors and a BMC board may include signals that operate at five gigahertz (5 GHz) or greater, such as Universal Serial Bus (USB) 3.0, Peripheral Component Interconnect Express (PCIe) 2.0/3.0, QuickPath Interconnect (QPI), Serial ATA (SATA), Serial Attached SCSI (SAS), etc. PCB module 110 with processors and memory, on the other hand, may be configured for handling less than 5 GHz signal routing. Therefore, PCB module 120 may use a lower-loss PCB material than PCB module 110 may use.

In various embodiments, a routing feature may be manufactured to route signals between PCB module 110 and PCB module 120 after the modules are bonded together. As an example, via 144 and via 146 may be drilled through PCB module 120, and extended to PCB module 110. In some embodiments, vias may be drilled from either PCB module 110 or PCB module 120. In some embodiments, vias may be drilled through one PCB module or both PCB modules. Signals may then be routed through these cross-module vias if such signals need to be routed between PCB module 110 and PCB module 120.

Modular PCB 100 disclosed herein may be used to accelerate PCB development while reducing total PCB cost for complex multi-layer PCB designs such as PCBs designated for server-class products. Implementing the technologies disclosed herein allows a PCB design engineer to route portions of a product design on different modules and then combine the modules during PCB manufacturing to form a multi-module PCB for the product. A PCB design engineer may reuse previously designed complex PCB modules while avoiding having to retest the previously characterized PCB modules. This allows the PCB design engineer to increase the IO density in a PCB and improve signal integrity characteristics of high speed signals without utilizing expensive interconnect technologies like blind vias (e.g., vias that connect a PCB outer layer to a PCB internal layer) and buried vias (e.g., vias connecting two internal layers).

Modular PCB 100 thus may provide an alternative to the extensive use of blind and buried vias, e.g., in Type 4 PCB technology, which is commonly seen in small footprint PCBs such as those used in mobile communication devices.

Modular PCB 100 may be used in a server baseboard design to provide various improvements and/or advantages over traditional server PCB design. In other embodiments, such improvement and/or advantages may also be realized on other types of complex PCB designs. Complex server baseboard PCBs are typically larger than mobile phone PCBs for various reasons. For example, server processors, memory, and network devices are typically at least ten times larger than their respective counterparts on mobile phones. Further, the number of IO signals on a server baseboard may be dramatically higher than that on a mobile phone PCB because of the greater number of processor IO signals, memory IO signals, and network IO signals in a server PCB. As an example, the number of IO signals in a server-class baseboard may be fifty times more than what is on a mobile phone PCB. Moreover, in some embodiments, server PCB components may consume more than a hundred times the power consumed by a mobile phone PCB. In that sense, the total power supported by a server baseboard is typically greater than a mobile phone PCB because server components typically consume more power than mobile phone components. Typical mobile phone designs use Type 4 PCB technology. However, Type 4 PCB technology, when applied to a server baseboard, often increases the cost of the server baseboard by at least a factor of two for various reasons, such as the server baseboard may require ten to a hundred times more vias for increased signal routing density and/or intensity, more surface area, higher cost dielectric materials, or much lower production volume.

Current design trends of server-class PCBs typically require the use of blind and buried vias to increase the signal quality of high-speed signals and increase routing density. However, use of the technologies described herein may allow a PCB design engineer to avoid or reduce blind and buried vias while still increasing the signal quality of high-speed signals as well as routing density. In various embodiments, the modular PCB design described herein may be two to three times less expensive than using blind and buried vias on server-class PCBs.

FIG. 2 is a schematic block diagram illustrating an example computing device incorporating aspects of the present disclosure, in accordance with various embodiments. In embodiments, PCB module 202 may include a processor and associated memory, while PCB module 204 may include various IO components and a BMC.

In various embodiments, a complex PCB design may be separated into multiple less-complex modules that, when combined using the technologies described herein, form a finished product. The less-complex modules, e.g., PCB module 204, may be fabricated using standard high-volume and low-cost PCB technologies typically used in servers PCBs. The more-complex modules, e.g., PCB module 202, which may be fabricated using higher cost PCB technologies as compared to the cost for fabricating PCB module 204, come with greater reusability. For example, PCB module 202 may be reused to couple to various different less-complex PCB modules as long as they are designed to be compatible with a known interface to PCB module 202. Consequently, the disclosed technologies may simplify the design of a server or other computing devices.

Moreover, as depicted in FIG. 2, signals may be routed among various components within PCB module 202 or PCB module 204. Therefore, modular PCB technologies disclosed herein may alleviate the need in a traditional design of a server PCB where IO signals may need to be routed through regions where high current IO voltage regulators or memory modules exist. Further, modular PCB technologies disclosed herein may also alleviate the need of the parallel routing of PCIe and/or memory signals on adjacent layers in a typical server PCB board. Therefore, even a complex server PCB may be designed with a profile with less than twelve layers by utilizing modular PCB technologies.

Figure 6:
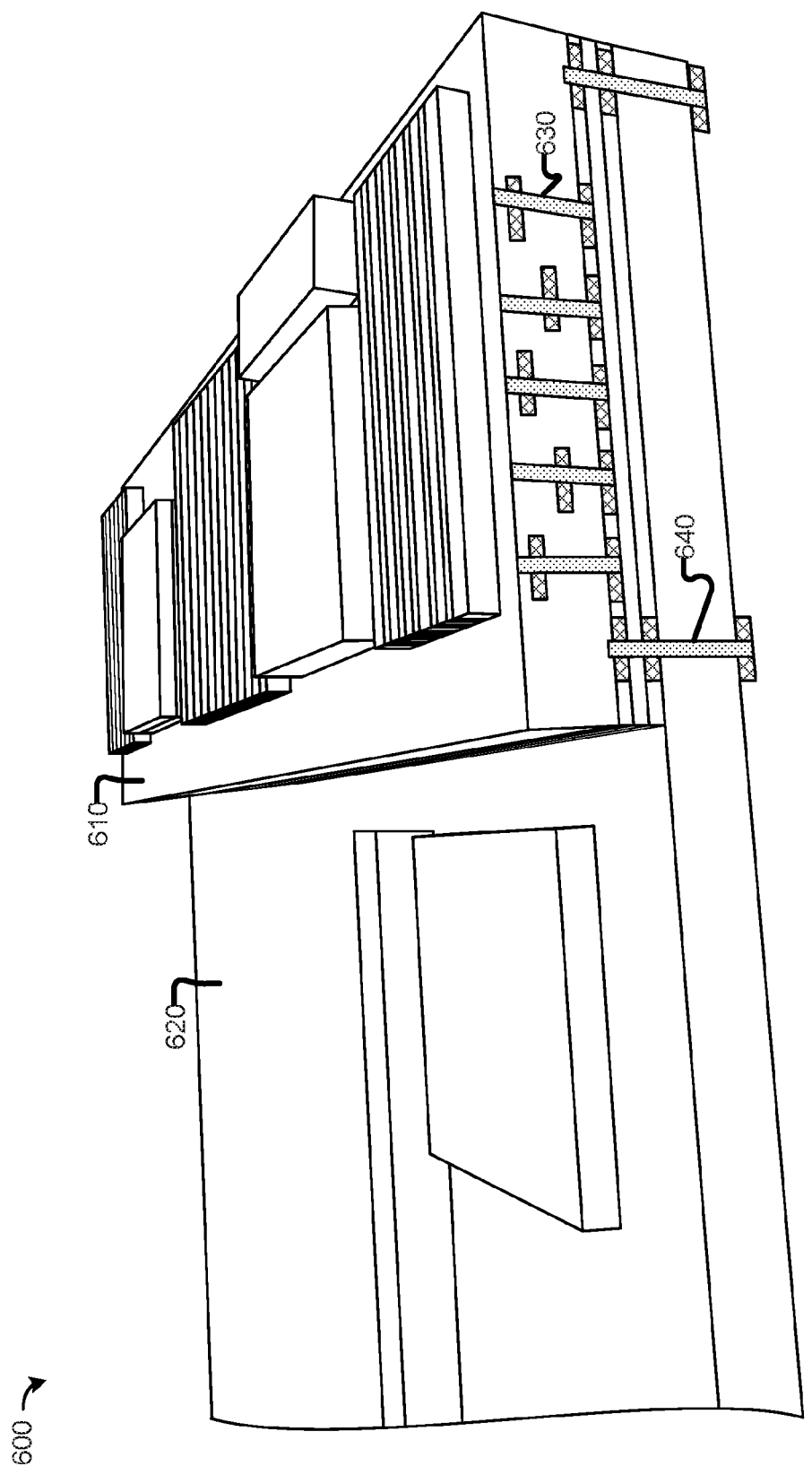
FIG. 6 is a schematic diagram of at least yet another embodiment of a computing device having a modular PCB incorporating aspects of the present disclosure, in accordance with various embodiments.

In various embodiments, many vias of a particular PCB module do not intrude on routing channels or ground and power planes of another PCB module. Buried and blind vias may still be used within an individual module, but they are not needed to route signals from one PCB module to another, for example, as illustrated in FIG. 6. Resultantly, the finished PCB may have fewer vias extending between the individual modules because many vias may be isolated to one of the modules.

Figure 3:
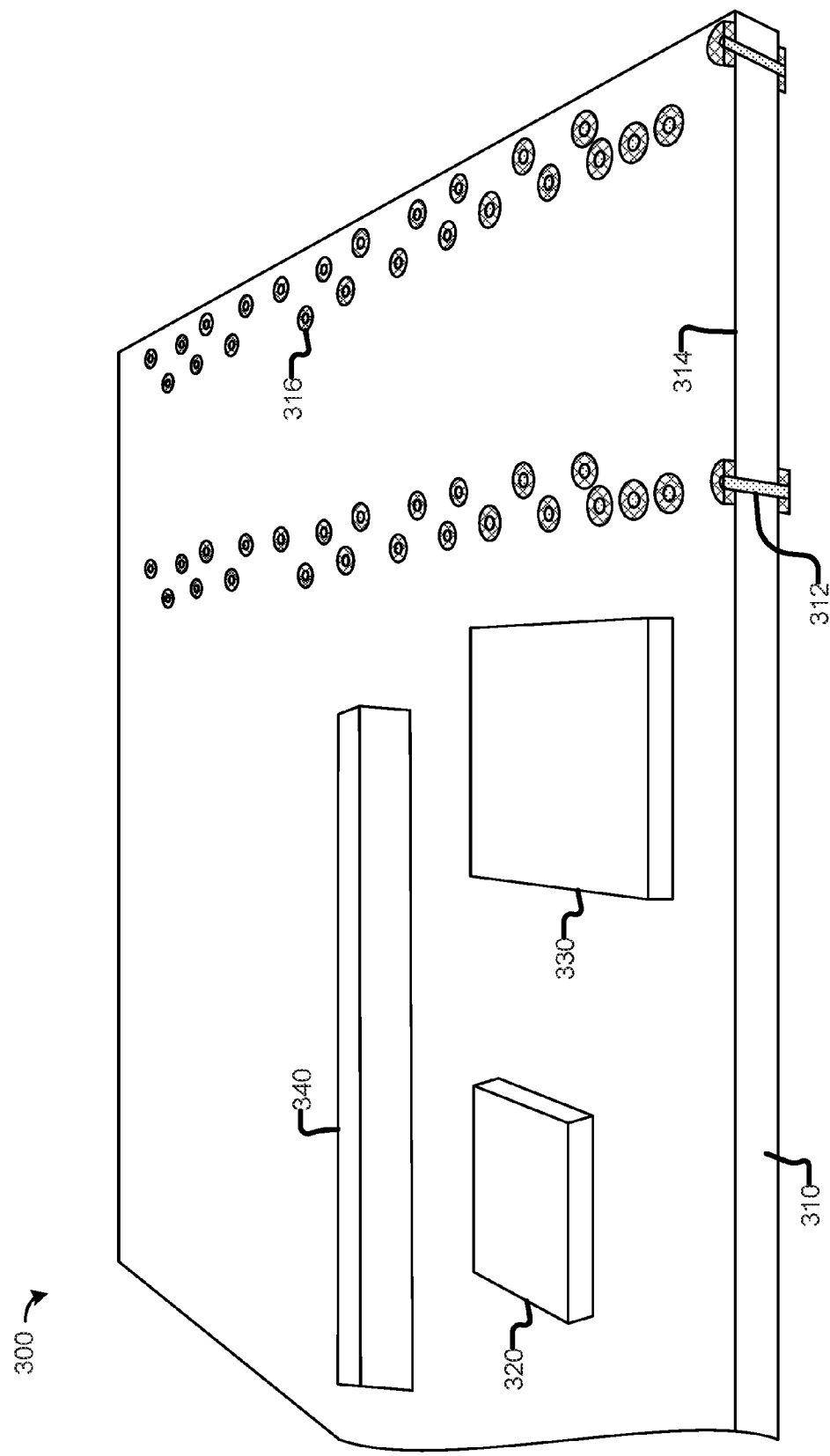
FIG. 3 is a schematic partially exposed view illustrating an example lamination via pattern on a PCB module incorporating aspects of the present disclosure, in accordance with various embodiments.

FIG. 3 is a schematic partially exposed view illustrating an example lamination via pattern 316 on PCB module 300 incorporating aspects of the present disclosure, in accordance with various embodiments. In embodiments, PCB module 300 may include BMC 320, PCH 330, and Peripheral Component Interconnect (PCI) 340, hosted on substrate 310. Substrate 310 may include lamination via pattern 316 defined on side 314 of the substrate. Lamination via pattern 316 may be uniquely designed in different embodiments.

In embodiments, lamination via pattern 316 may be shared by another PCB module, such as PCB module 110 in connection with FIG. 1. In some embodiments, a shared lamination via pattern may include corresponding via pads on two PCB modules, wherein each via pad of one PCB module may be coupled to a respective via pad of another PCB module. In some embodiments, lamination via pattern 316 may only include either a subset or a superset of via pads on a counterpart PCB module when only the subset or the superset of via pads need to be connected in that particular embodiment. In various embodiments, lamination via pattern 316 may be aligned with and electrically coupled to its corresponding lamination via pattern on another PCB module without connectors (e.g., bumps, pillars, etc.), such as based only on a lamination layer to bond the two PCB modules together and vias subsequently drilled and plated to create the electrical connection.

In various embodiments, mass lamination registration hole 312 may be used to facilitate such coupling of two PCB modules. In some embodiments, the area containing mass lamination registration hole 312 may be scrapped away from PCB module 300 once two PCB modules are coupled to each other. Mass lamination registration hole 312 may be aligned with and coupled to a corresponding mass lamination registration hole on another PCB module based on a mass lamination pin (not shown). Resultantly, the lamination via patterns on the two PCB modules may be in alignment with each other when another PCB module is placed on top of PCB module 300. In some embodiments, metal may be electroplated on the vias connecting aligned pads of two PCB modules. Therefore, an individual pad of lamination via pattern 316 may be electrically coupled to a corresponding individual via pad on another PCB module.

Figure 4:
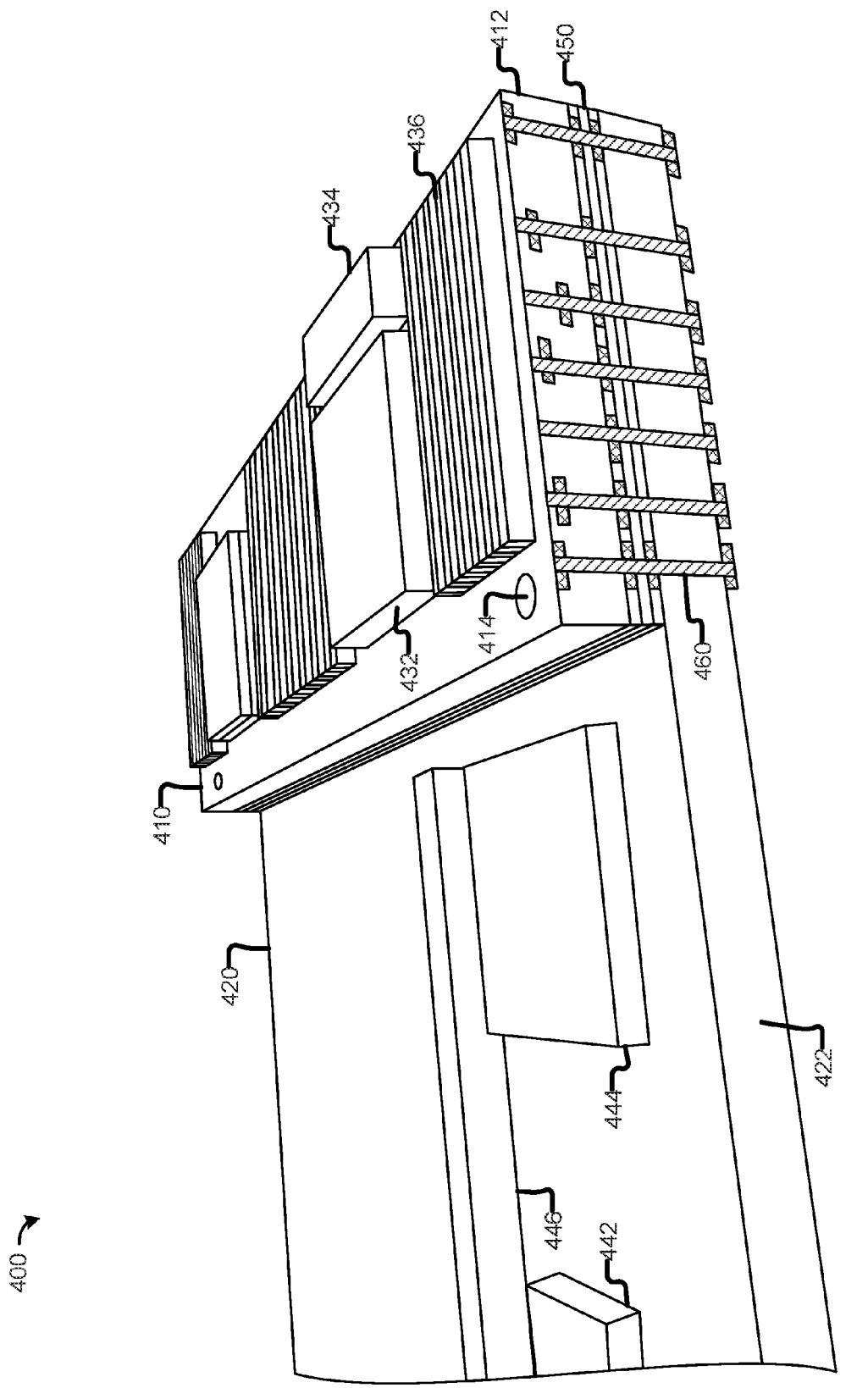
FIG. 4 is a schematic diagram of at least one embodiment of a computing device having a modular PCB incorporating aspects of the present disclosure, in accordance with various embodiments.
Figure 5:
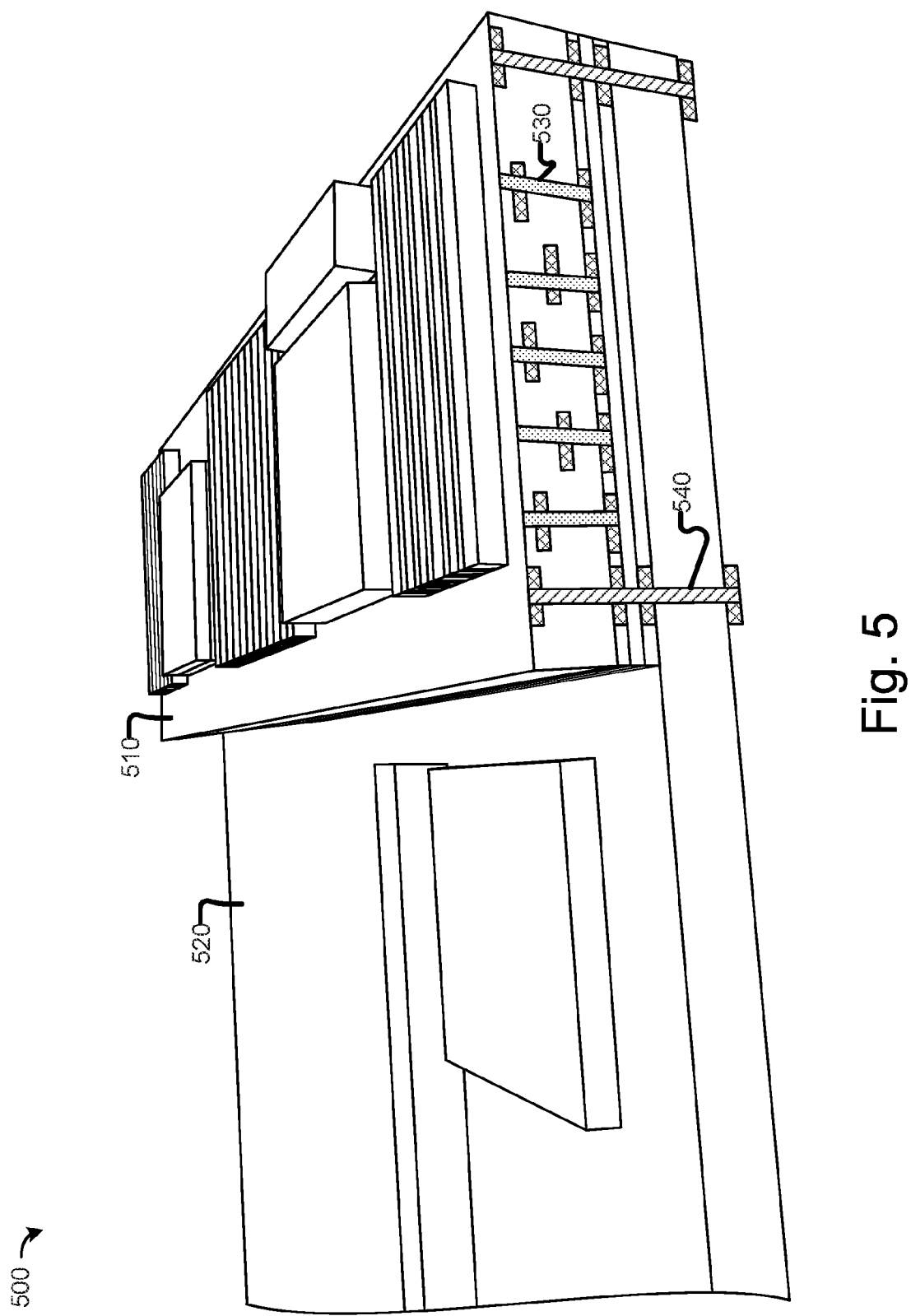
FIG. 5 is a schematic diagram of at least another embodiment of a computing device having a modular PCB incorporating aspects of the present disclosure, in accordance with various embodiments.

Referring now to FIG. 4 to FIG. 6, several embodiments of a computing device having a modular PCB, incorporating aspects of the present disclosure, are shown and described below. Modular PCB 400 may include processor module 410 and IO module 420. In various embodiments, processor module 410 may include processor 432, memory 436, and voltage regulator 434 secured on substrate 412. IO module 420 may include BMC 442, PCH 444, and PCI 446 hosted on substrate 422. Either substrate 412 or substrate 422 may have a multiple-layered profile.

In various embodiments, processor module 410 and IO module 420 may be bonded together based on bonding layer 450. In some embodiments, bonding layer 450 may include pre-preg material with epoxy resin, wherein the fibers and the epoxy resin may form a weave to bond adjacent materials together. Additionally, one or more mass lamination registration holes 414 may be utilized to align the shared lamination via patterns on processor module 410 and IO module 420. In some embodiments, mass lamination registration holes may be off the final modular PCB to improve the board real estate utilization. In some embodiments, mass lamination registration holes may be buried in the board outline and still function as mounting holes.

In various embodiments, routing features may be manufactured to route signals between processor module 410 and IO module 420 after the modules are bonded together. As an example, a through hole may be drilled through processor module 410 and IO module 420 with respect to the modular PCB 400 to form via 460. In some embodiments, vias may be drilled from either processor module 410 or IO module 420. In some embodiments, vias may be drilled through one PCB module but not the other. Signals may then be routed through these cross-module vias after drilling and plating.

In various embodiments, utilizing modular PCB 400 may allow a PCB designer to design a server using a single input/output module (e.g., IO module 420) with a single-processor module (e.g., processor module 410) or a multiple-processor module (not shown). For example, as discussed above, the illustrative processor module 410 may include processor 432, memory 436, and voltage regulator 434 secured to substrate 412; and IO module 420 may include BMC 442, PCH 444, and PCI 446 secured to substrate 422. In other embodiments, processor module 410 may include additional voltage regulators or other components. Similarly, IO module 420 may include other IO interfaces, high-speed IO routing, platform controllers, or hardware controllers. In other embodiments, processor module 410 and/or IO module 420 may include more or fewer components than shown in FIG. 4.

In various embodiments, processor module 410 and IO module 420 may be manufactured in parallel since they are separate modules. Of course, it is not necessary for processor module 410 to be manufactured simultaneously with IO module 420. Indeed, either module may be manufactured in advance of the other, which provides the flexibility for the modules to be manufactured by different manufacturers according to a particular design.

In various embodiments, processor module 410 may be designed as a stand-alone board, which may be an eight-layer design for many modern processors. If signals must be routed from processor module 410 to IO module 420, such signals may be routed to vias connecting these two modules, such as via 460.

In some embodiments, the loss characteristics of processor module 410 are not critical relative to that of the IO module 420 due to the lack of 5 GHz or greater signal routing within processor module 410. However, IO module 420 may include signals that operate at 5 GHz or greater. Thus, it is advantageous to separate a server baseboard into multiple PCBs so that the dielectric used in each PCB may be tailored to characteristics of the signals routed in each board. As an example, IO module 420 may require lower loss dielectric than processor module 410.

Another advantage for separating a server baseboard into multiple PCBs is that processor module 410, which usually contains complex design, may be reused for more than one IO module. Once a processor module is appropriately designed, the level of signal interference between the processor module and an IO module can be low enough such that the processor module may be reused for various IO modules. Therefore, the need to test or calibrate the performance of the processor module for each different IO module may be mitigated because one successful designed processor module 410 may be reused to adapt to different IO modules or different types of servers, for example, manufactured by different downstream manufacturers. Such improved reusability may result in a quicker design time and reduced overall cost of the server PCB design. As an example, modular PCB design may be up to three times less expensive than using blind and buried vias on a server-class platform. On the other hand, consumers may also be benefited from recycling the complex processor module 410 for an upgraded IO module in the future.

In various embodiments, a modular PCB design may reduce the routing topology complexity. For example, a modular PCB design may reduce coupling between processor and IO signaling or between memory traces and IO routing. As another example, a modular PCB design may allow shorter via stubs on high-speed signal routing. Further, signals may be routed between processor module 410 and IO module 420 without going through any connectors. Thus, a modular PCB design may avoid complex routing topologies when signals among processor, memory, VRs, etc. are all routed in the same area. Additionally, a modular PCB design may allow for product designs where no power or memory vias from processor module 410 are routed to IO module 420, which may dramatically decrease the total processor baseboard area in some embodiments.

Referring now to FIG. 5, in another embodiment, an incomplete blind via technique may be used after bonding processor module 510 to IO module 520. In some embodiments, processor module 510 may be plated first before the process to bond processor module 510 to IO module 520. Similar to the above discussion, one or more lamination pins (not shown) may be used to align the processor module 510 with IO module 520. After processor module 510 is bonded with IO module 520, blind via 530, which is exposed only on the side of processor module 510, may be drilled and made conductive, e.g., by electroplating. Similarly, via 540, which goes through both modules with respect to the modular PCB 500, may also be drilled and plated.

Referring now to FIG. 6, in another embodiment, processor module 610 and/or the IO module 620 may utilize blind vias, for example, when a dense routing of signals in either processor module 610 or the IO module 620 may be required. As shown, via 630 only extends within processor module 610, while via 640 extends from IO module 620 to processor module 610 without extending all of the way through processor module 610. In some embodiments, via 640 may be manufactured as through holes in IO module 620 during manufacture of IO module 620. In other embodiments, via 640 may be drilled after the bonding process, which bonds the two modules together. In various embodiments, the resulting via 630 or 640 becomes a blind via with respect to the modular PCB 600.

Figure 7:
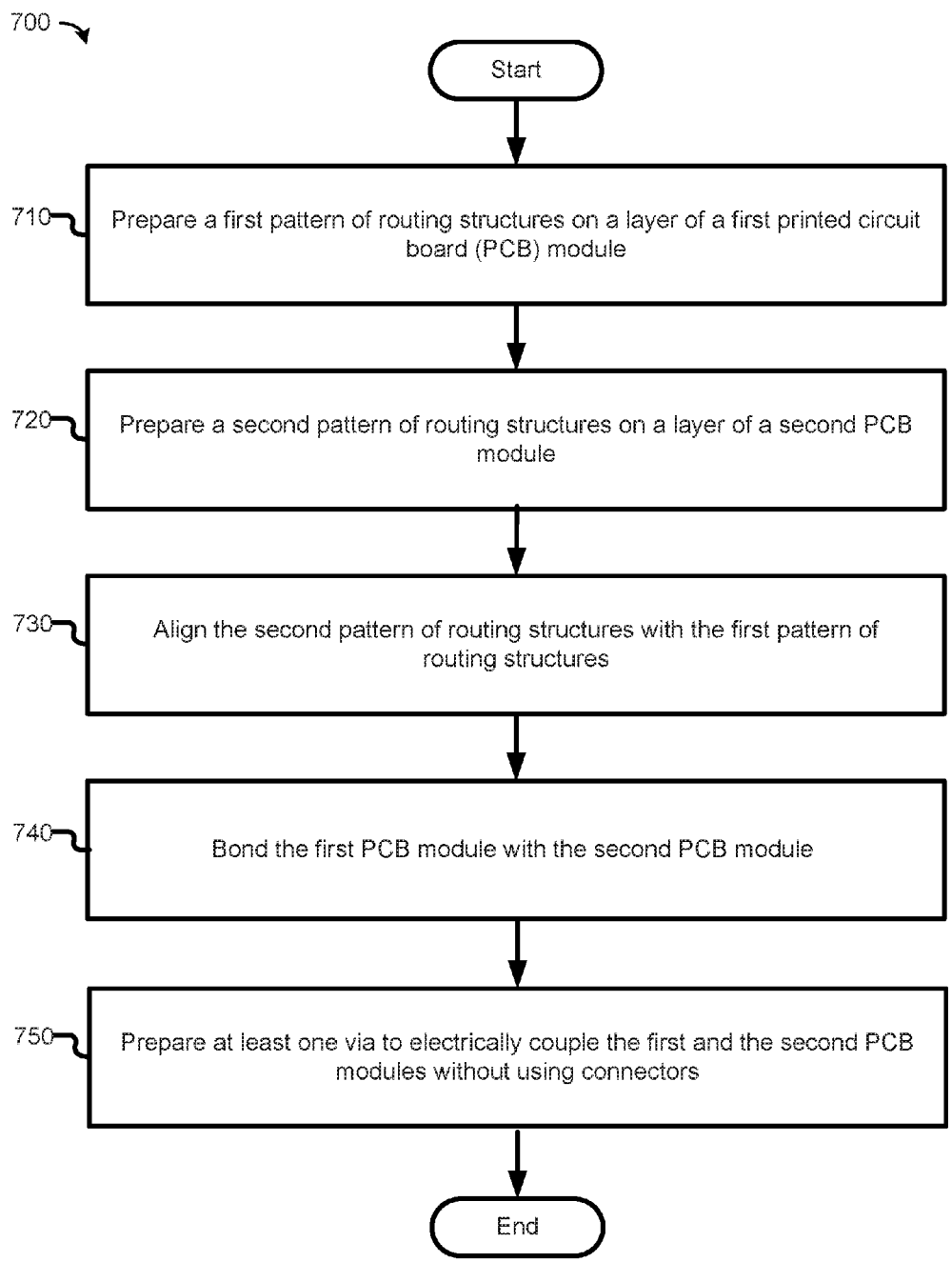
FIG. 7 is a flow diagram of an example process for producing a modular PCB, incorporating aspects of the present disclosure, in accordance with various embodiments.

FIG. 7 is a flow diagram of an example process for producing a modular PCB, incorporating aspects of the present disclosure, in accordance with various embodiments. As shown, process 700 may be performed to produce one or more embodiments of a computing device with at least one modular PCB according to the present disclosure.

In embodiments, the process may begin at block 710, where a first pattern of routing structures may be prepared on a layer of a first printed circuit board (PCB) module. In embodiments, the first pattern of routing structures may include a lamination via pattern, which may be predetermined based on a server design. In embodiments, the first pattern of routing structures may also include trenches or other routing structures. In embodiments, the first PCB module may include one or more processors, memory, and/or VRs.

Next, at block 720, a second pattern of routing structures may be prepared on a layer of a second PCB module. In embodiments, the second pattern of routing structures may include a lamination via pattern corresponding to the lamination via pattern formed on the first PCB module. Therefore, respective via pads of the first and second pattern of routing structures may be paired.

Next, at block 730, the second pattern of routing structures may be aligned with the first pattern of routing structures. In embodiments, respective mass lamination registration holes from the first and second PCB modules may be aligned together using mass lamination pins. Subsequently, the lamination via patterns on the two PCB modules may be in registry with each other, e.g., via pads on two PCB modules may be paired with each other.

Next, at block 740, the first PCB module may be bonded with the second PCB module. In embodiments, a layer of pre-impregnated composite fibers with epoxy resin may be used to bond the first PCB module with the second PCB module. In a bonding process, the fibers and the epoxy resin may bond adjacent materials together under a heated and pressured environment.

Next, at block 750, at least one via may be prepared to electrically couple the first and the second PCB modules without using connectors, e.g., by way of drilling and electroplating. Electrical interconnects or connectors are commonly used to connect two or more electronic components together. As an example, two PCB modules may be electrically connected using various means of electrical connectors, such as electrical wiring, solder balls, solder bumps, metal springs, etc. As used in this disclosure, connectors do not include electroplating. In embodiments, through vias or through-hole type of vias may be drilled and plated from either the first or second PCB module, for example, as illustrated in connection with FIG. 4 to FIG. 6. In embodiments, via pads on the first PCB module may be connected to respective via pads on the second PCB module without any connectors, e.g., by drilling and electroplating vias to electrically couple aligned pads together. Therefore, signals may be routed among multiple PCB modules in a modular PCB or be further routed within each PCB module.

Figure 8:
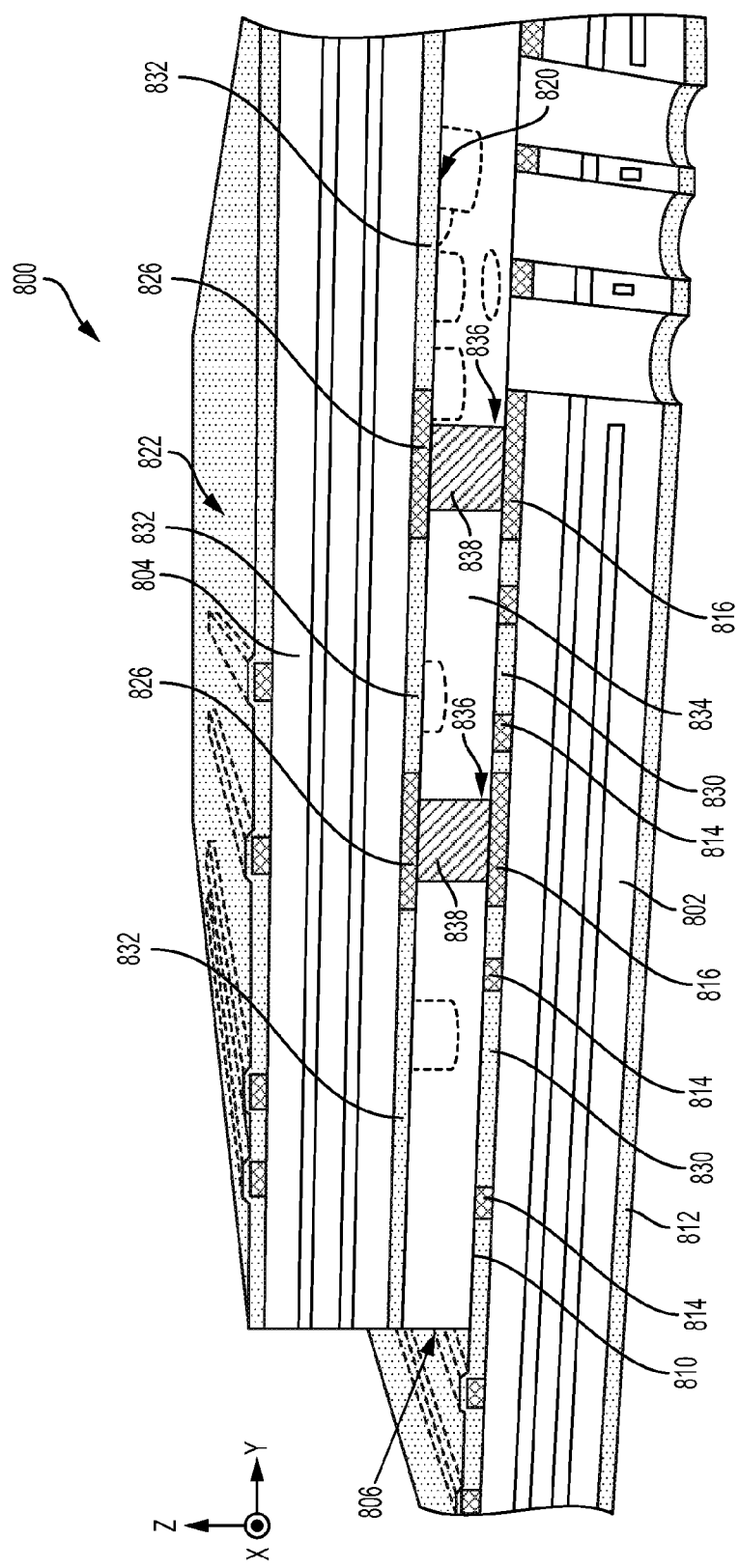
FIG. 8 depicts a cross-sectional view of an example modular PCB according to some embodiments.

FIG. 8 depicts a cross-sectional view of an example modular PCB 800 according to some embodiments. Modular PCB 800, also referred to as a PCB structure, as depicted, may include a PCB module 802, a PCB module 804, and a middle layer or structure 806 between the PCB module 802 and PCB module 804.

Each of PCB module 802 and PCB module 804 may include a plurality of structures such as, but not limited to, electrical circuitry, components, devices, traces, patterns, and the like formed in and/or on one or more board layers. The structures included in PCB modules 802 and 804 may be the same or different from each other. The number of layers in each of PCB module 802 and 804 can be the same or different from each other. For example, PCB module 802 may include a fewer number of layers (e.g., four layers) than PCB module 804 (e.g., twelve layers). The functionalities provided by each of PCB modules 802 and 804 may be of different type and/or degree of complexity from each other. For example, PCB module 804 may provide more complex functionalities than PCB module 802, and may correspondingly include more complex structures than in PCB module 802. As another example, PCB module 802 may be designed to be used with another PCB module from among a plurality of other PCB modules, each of the other PCB modules having a different design, complexity, and/or functionality from each other. PCB module 802 may include reference circuitry and reference PCB design that makes it compatible with any of the other PCB module, from among the plurality of other PCB modules, to be positioned above it to form a modular PCB, without changing the PCB module 802 for each of the other PCB modules. In some embodiments, PCB module 802 can be similar to any of PCB modules 120, 204, 300, 420, 520, and/or 620 discussed above. PCB module 804 can be similar to any of PCB modules 110, 202, 300, 410, 510, and/or 610 discussed above.

PCB module 802 may be referred to as a bottom PCB module, a base PCB module, a base board, and the like. PCB module 804 may be referred to as a top PCB module. In FIG. 8, PCB module 802 is shown stacked below the middle layer 806 and the PCB module 804. PCB module 804 and middle layer 806 are positioned above only a portion of the PCB module 802, according to some embodiments. The "sandwich" structure formed by the PCB module 802, middle layer 806, and PCB module 804 need not extend across all of the PCB module 802 and/or 804. For example, the surface area or size of PCB module 804 may be smaller than that of PCB module 802.

PCB module 802 may include an inner surface or side 810, which may be immediately adjacent to the middle layer 806, and an outer surface or side 812 that is an opposing surface/side to the inner surface 810 and furthest from the middle layer 806. PCB module 804 may include an inner surface or side 820, which may be immediately adjacent to the middle layer 806, and an outer surface or side 822 that is an opposing surface/side to the inner surface 820 and furthest from the middle layer 806. In the orientation depicted in FIG. 8, the inner surface or side 810 may comprise the top of the PCB module 802 while the inner surface or side 820 may comprise the bottom of the PCB module 804.

The inner surface or side 810 of PCB module 802 may include a plurality of structures: one or more conductive features 814 (e.g., copper lines or traces) and one or more via pads 816 (e.g., to facilitate electrical coupling between PCB modules 802 and 804). In some embodiments, conductive features 814 may be absent. Moreover, the relative arrangement, number, and distance between respective ones of the conductive features 814 and/or via pads 816 may differ from that shown in FIG. 8. In an embodiment, the conductive features 814 and via pads 816 may comprise a conductive material, such as copper, and the height or thickness of the conductive features 814 and via pads 816 (e.g., z-height with respect to the z-axis) may be approximately 1.4 mil. In other embodiments, other materials and/or thickness may be implemented.

The inner surface or side 820 of PCB module 804 may include a plurality of structures: one or more via pads 826 and, optionally, one or more conductive features (not shown). The relative arrangement, number, and distance between respective ones of the conductive features and/or via pads 826 may differ from that shown in FIG. 8. In an embodiment, the conductive features and via pads 826 may comprise a conductive material, such as copper, and the height or thickness of the conductive features and via pads 826 (e.g., z-height with respect to the z-axis) may be approximately 1.4 mil. In other embodiments, other materials and/or thickness may be implemented. For instance, the thickness of via pads 826 may be the same or different from via pads 816. In an embodiment, as described in greater detail below, the location and number of via pads 826 correspond to the location and number of via pads 816.

Middle layer 806 (also referred to as a middle structure or middle stack) may include a first valley filler layer 830, a second valley filler layer 832, and a bonding layer 834 between the first valley filler layer 830 and the second valley filler layer 832. In an embodiment, the first valley filler layer 830 may be coplanar with (in the x-y plane) and the same (or similar) height/thickness as the conductive features 814 and via pads 816 of PCB module 802. As described in detail below, first valley filler layer 830 may be located in the valleys or space between structures located at inner surface or side 810, such as between conductive features 814 and via pads 816. Because the conductive features 814 and via pads 816 have a certain height or thickness, in between such features are empty spaces or valleys, which may be "filled in" by the first valley filler layer 830. In an embodiment, first valley filler layer 830 may comprise a non-conductive material such as, but not limited to, a photo-imageable solder mask or a liquid photo-imageable solder mask (LPSM).

The second valley filler layer 832 may be similar to the first valley filler layer 830, except the second valley filler layer 832 may be coplanar with (in the x-y plane) and the same (or similar) height/thickness as via pads 826 of PCB module 804. Second valley filler layer 832 may be located in the valleys or space between structures located at inner surface or side 820, such as between via pads 826. Second valley filler layer 832 may comprise a non-conductive material such as, but not limited to, a photo-imageable solder mask or a liquid photo-imageable solder mask (LPSM).

Bonding layer 834 may at least partially bond or secure PCB modules 802 and 804 to each other. In an embodiment, bonding layer 834 may include a dielectric material such as, but not limited to, a low flow pre-preg material comprising pre-impregnated fiberglass (or other fibers) and epoxy resin that form a weave to bond adjacent materials together. Bonding layer 834 may comprise the same or similar material used within the PCB modules 802 or 804, such as those used between board layers to provide electrical isolation, adhesion, and/or structural integrity among the various layers therein.

In an embodiment, the thickness of bonding layer 834 may be 4 mil. In other embodiments, bonding layer 834 may be thicker or thinner than 4 mil such as, but not limited to, 2 mil, 6 mil, 8 mil, 12 mil, and the like. Bonding layer 834 may be thick enough to provide desired electrical properties (e.g., prevent cross talk, cross linkage, or other undesirable electrical connections), withstand fabrication processes (e.g., applied pressure to PCB modules 802 and 804), provide desired height or thickness requirements (e.g., desired cavity depth, satisfy enclosure height restrictions, etc.), and the like.

As described in detail below, bonding layer 834 may include a plurality of vias 836 that extend through the height or thickness of the bonding layer 834. Each via of the plurality of vias 836 may be filled with a via filler 838. Via filler 838 may comprise a conductive material such as, but not limited to, a sintered conductive paste that is a metal and epoxy paste compound. When heated (cured), the epoxy may be removed, leaving the metal pellets/pieces to partially fuse together, thereby forming an electrical pathway. Each via filler 838 corresponding to the respective via of the plurality of vias 836 may be aligned with a corresponding pair of via pads 816 and 826, thereby providing electrical coupling between particular structures of PCB modules 802 and 804.

As described above in connection with FIG. 3, in embodiments, each via pad 826 (also referred to as a via pattern) of PCB module 804 may be aligned with and electrically coupled to its corresponding via pad 816 (also referred to as a via pattern) of PCB module 802 without connectors (e.g., bumps, pillars, etc.). Instead, bonding layer 834 may bond or secure PCB modules 802 and 804 together, and via filler 838 in the respective one of the plurality of vias 836 corresponding to the particular pair of via pads 826 and 816 completes the electrical coupling between a particular structure in the PCB module 802 with a particular structure in the PCB module 804.

Although not shown, one or more mass lamination registration holes may be utilized to align the shared lamination via patterns on PCB modules 802 and 804. In some embodiments, mass lamination registration holes may be off the final modular PCB 800 to improve the board real estate utilization. In some embodiments, mass lamination registration holes may be buried in the board outline and function as mounting holes.

Although middle layer 806 is described above as including the first valley filler layer 830, second valley filler layer 832, and bonding layer 834, such grouping is for illustrative purposes only. Alternatively, first valley filler layer 830 may be considered to be a part of the PCB module 802 and/or the second valley filler layer 832 may be considered to be a part of the PCB module 804. Accordingly, the various groupings disclosed herein in no way limits items within the groupings or the overall structure.

Figure 9:
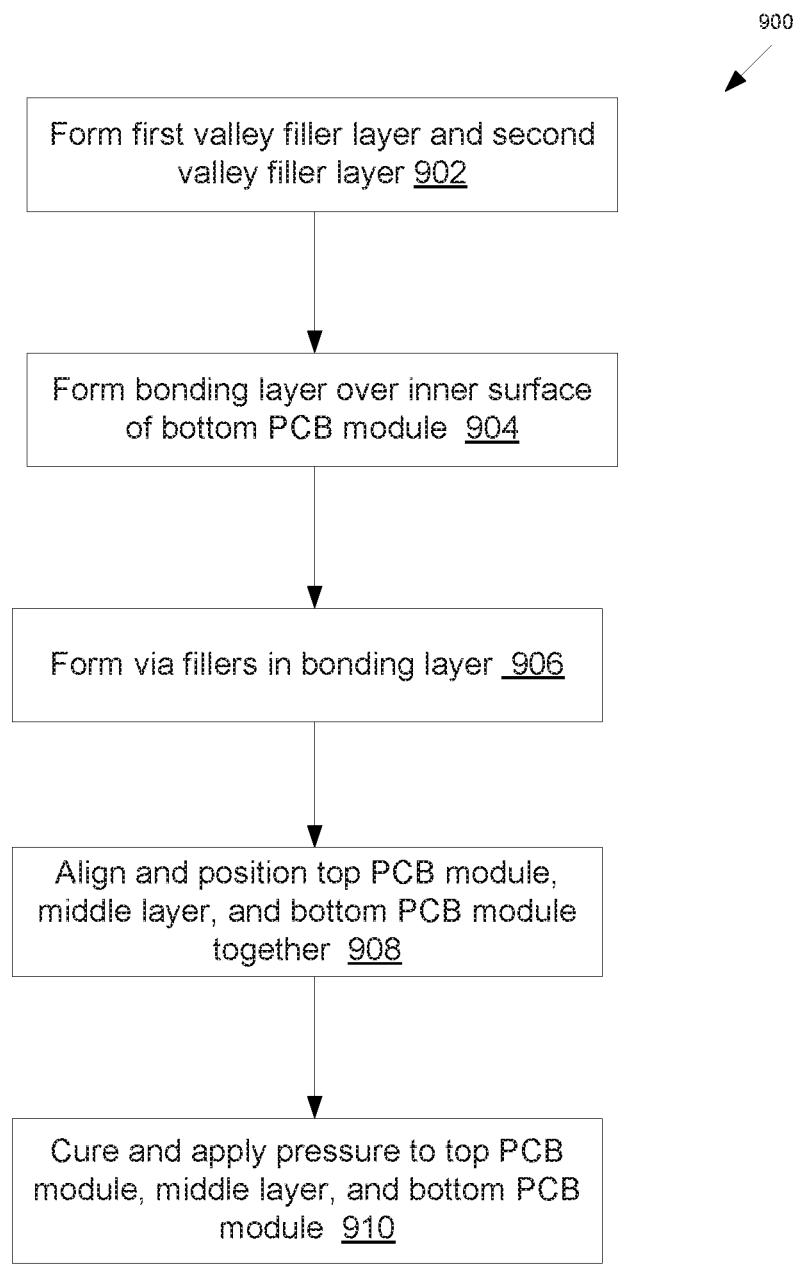
FIG. 9 depicts a flow diagram of an example process for producing the modular PCB of FIG. 8, according to some embodiments.
Figure 10B:
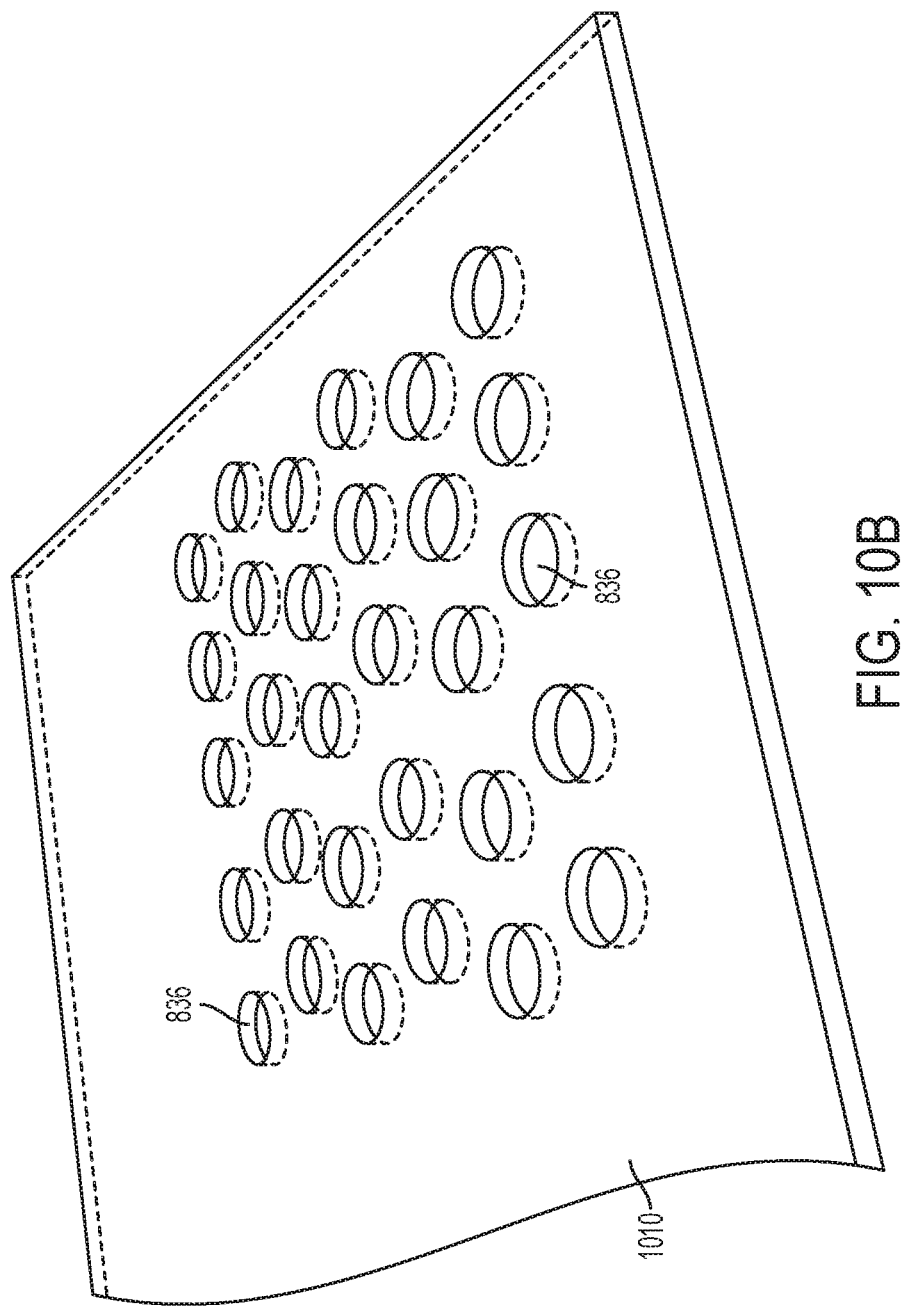

FIG. 9 depicts a flow diagram of an example process 900 for producing the modular PCB 800, according to some embodiments. FIGS. 10A-10C depict cross-sectional or perspective views of example portions of the modular PCB 800 during fabrication, according to some embodiments. FIG. 9 is described below in conjunction with FIGS. 10A-10C.

In block 902, first valley filler layer 830 and second valley filler layer 832 may be formed on respective inner surface or side 810 of PCB module 802 and inner surface or side 820 of PCB module 804, wherein each of the resulting inner surfaces may be a flat or substantially flat surface. In an embodiment, a non-conductive material such as liquid photo-imageable solder mask may be applied or poured over each of the inner surface or side 810 of PCB module 802 and the inner surface or side 820 of PCB module 804. The valleys or spaces between features (e.g., conductive features 814, via pads 816, via pads 826) exposed on the inner surface or side 810 of PCB module 802 and the inner surface or side 820 of PCB module 804 may be filled in with the non-conductive material; thereby forming the first valley filler layer 830 and the second valley filler layer 832.

Because the non-conductive material coats the entire inner surface or side 810 of PCB module 802 and the inner surface or side 820 of PCB module 804, features exposed on the inner surface or side 810 and the inner surface or side 820 are also initially coated with the non-conductive material. For example, in FIG. 10A, non-conductive material 1004 may coat a conductive feature 1002. Conductive feature 1002 may be similar to conductive feature 814. A similar coating may also exist over each of the other features (e.g., via pads 816) on the inner surface or side 810. In an embodiment, a composite image may be used in the photo imaging process to remove such excess material existing over each of the exposed features located within a sandwich structure portion of the modular PCB 800 from each of the inner surface or side 810 of PCB module 802 and the inner surface or side 820 of PCB module 804. Non-conductive material existing over any portions of the inner surface or side 810 of PCB module 802 and the inner surface or side 820 of PCB module 804 that are outside the sandwich structure—regions where PCB modules 802 and 804 are not stacked together—need not be removed.

For the inner surface or side 810 of PCB module 802, a composite image may used to remove excess material from within the sandwich structure portion of such surface. The composite image may comprise, in an embodiment, a negative image of the features on the inner surface or side 810 within the sandwich structure area merged with a positive image of the features on the inner surface or side 810 outside the sandwich structure area. Such composite image may be projected on the inner surface or side 810 and photo imaging processing occurs (photomask, UV light, chemical bath, etc.) to remove the non-conductive material from selective areas within the sandwich structure. Hence, the non-conductive material covering each of the existing features on the inner surface or side 810 within the sandwich structure may be removed, resulting in a flat or substantially flat surface across the entire sandwich structure area 1006.

Similar processing may also occur on the inner surface or side 820 of PCB module 804 to remove the non-conductive material coating existing features within the sandwich structure area 1006. The composite image used in the photo imaging process may comprise, in an embodiment, a negative image of the features on the inner surface or side 820 within the sandwich structure area merged with a positive image of the features on the inner surface or side 820 outside the sandwich structure area. The resulting surface of the inner surface or side 820 may also be flat or substantially flat across the entire sandwich structure area 1006.

In block 904, bonding layer 834 may be formed over the inner surface or side 810 of PCB module 802 that includes the first valley filler layer 830. In an embodiment, the bonding layer 834 may comprise a low flow pre-preg material, which may be in a sheet form of a certain thickness (e.g., 4 mil thickness). Such a sheet may be laid over the inner surface or side 810 of PCB module 802. Then the plurality of vias 836 may be formed in the sheet using, for example, a laser to ablate selective portions of the sheet that align with via pad locations on the inner surface or side 810. The alignment process may include optical alignment as well as use of a data file of the exact feature pattern locations to determine where to apply the laser beam. The plurality of vias 836 may be considered to be "post-drilled" since they are formed after the sheet is laid on the PCB module 802.

In alternative embodiments, the sheet of low flow pre-preg material may be "pre-drilled" with the plurality of vias 836 prior to being applied to the PCB module 802. FIG. 10B depicts an example sheet 1010 of low flow pre-preg material that is "pre-drilled" with the plurality of vias 836. The vias may be drilled using mechanical means such as with a hole puncher. Sheet 1010 may be cooled to a low temperature to harden the material to drill more precise vias. More than one via may be drilled at the same time. In some embodiments, pre-drilling the vias may provide processing flexibility, efficiency, and/or precision over post-drilling methods. The location of each of the vias may correspond to the respective via pad location on the inner surface or side 810 similar to the discussion above. The "pre-drilled" sheet may then be applied over the PCB module 802 and positioned so that the plurality of vias 836 is in alignment with the via pads 816.

Although laser and mechanical drilling are mentioned above, other processes may be used to form the plurality of vias 836 in the "pre-drilled" or "post-drilled" sheets. For instance, whether "pre-drilling" or "post-drilling," laser, mechanical, chemical, or other processes may be implemented to remove select portions of the material comprising the bonding layer 834. In some embodiments, each via of the plurality of vias 836 may be cylindrically shaped.

Next, in block 906, via fillers may be formed in the plurality of vias 836 created in block 904. In an embodiment, a sintered conductive paste may be applied to the top of the bonding layer 834 (which now exists over the first valley filler layer 830); and in particular, the sintered conductive paste may be pushed or "squeegeed" into each via of the plurality of vias 836 to form the via fillers 838. FIG. 10C illustrates via fillers 838 filling the vias of the plurality of vias 836 in the bonding layer 834.

In block 908, PCB module 802, middle layer 806, and PCB module 804 may be aligned and positioned relative to each other as shown in FIG. 8. In some embodiments, since the first valley filler layer 830, bonding layer 834, and via fillers 838 may be formed above the inner surface or side 810 of PCB module 802, the inner surface or side 820 of PCB module 804 with the second valley filler layer 832 (as formed in block 902) may be placed over the bonding layer 834 to form the sandwich structure of modular PCB 800. PCB module 804 may be positioned relative to PCB module 802 such that each of the via pads 826 of PCB module 804 align with a corresponding via filler 838 and via pad 816 of PCB module 802. Although not shown, one or more alignment and/or positioning guides may be employed to ensure that structures of the PCB module 802 are in appropriate electrical connection or isolation from respective structures of the PCB module 804. For instance, mass lamination registration holes and pins in the PCB modules 802 and 804 may be used for alignment purposes.

Next in block 910, at least a portion of the modular PCB 800, such as the sandwich structure portion, may be cured and compressed to complete bonding/adhesion, electrical coupling/isolation, and other finalizing processes to form the modular PCB 800 that will operate with certain performance characteristics. In some embodiments, a pressure of 400 PSI may be applied to the PCB module 802, middle layer 806, and PCB module 804 in order to remove potential air gaps within the sandwich structure and to completely bond the PCB modules 802 and 804 together.

Due to the inclusion of the first valley filler layer 830 and second valley filler layer 832 within the sandwich structure, when the sandwich structure is cured and compressed, leakage of the via fillers 838 out of the plurality of vias 836 may be reduced, minimized or eliminated. The first valley filler layer 830 and second valley filler layer 832 may fill the valleys or empty space at the inner surfaces of the PCB modules 802 and 804 so that the via fillers 838 do not have a readily available empty space for migration. In the absence of such valley fillers, unintended electrical pathways may form from the leaked via filler, for example, between a particular via pad 816 and an adjacent structure, such as a conductive feature 830, another via pad 816, and/or a particular via pad 826. Moreover, given the electrical coupling intentionally formed between a combination of a particular via pad 826 in PCB module 804, a particular via filler 838, and a particular via pad 816 in PCB module 802, an unintended electrical pathway formed in one of the PCB module 802 or 804 may also result in formation of an electrical pathway between PCB modules 802 and 804.

Figure 11:
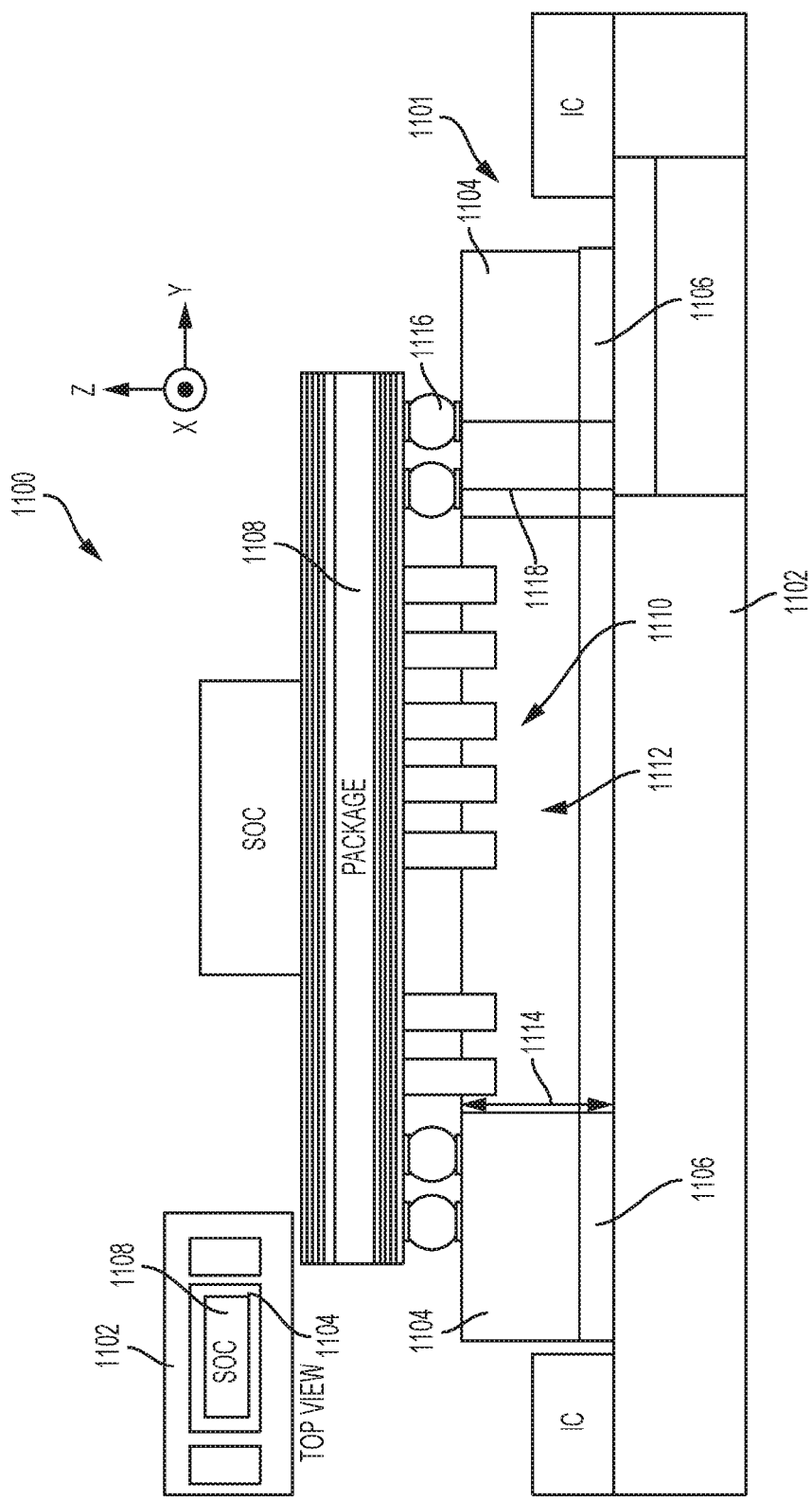
FIG. 11 depicts a cross-sectional view of an example PCB structure, according to some embodiments.

FIG. 11 depicts a cross-sectional view of an example PCB structure 1100 according to some embodiments. PCB structure 1100, as depicted, may include a PCB module 1102, a PCB module 1104, a middle layer or structure 1106, and a circuit package 1108. The middle layer 1106 may be above the PCB module 1102; PCB module 1104 may be above the middle layer 1106; and the circuit package 1108 may be above the PCB module 1104.

PCB module 1102, middle layer 1106, and PCB module 1104 may be similar to respectively, PCB module 802, middle layer 806, and PCB module 804 of FIG. 8. The structure formed by the combination of PCB module 1102, middle layer 1106, and PCB module 1104 may be referred to as a modular PCB 1101. Middle layer 1106 may also be referred to as a transfer layer.

In some embodiments, additional components, structures, circuitry, devices, chips, system on chip (SOC), memory, CPUs, or the like (collectively referred to as a circuit package, package, or on-package) may be mounted on modular PCB 1101, such as the circuit package 1108 shown in FIG. 11. Circuit package 1108 may include one or more structures 1110 on the bottom side of the package, which is the side closest to the modular PCB 1101. Structures 1110 may comprise a variety of types of structures including, but not limited to, electrical structures (e.g., capacitors), mechanical structures, non-electrical structures, optical structures, and the like. Structures 1110 may protrude from the bottom side of the circuit package 1108 and have a certain height (in the z-axis direction).

In order to locate the circuit package 1108 over the modular PCB 1101 without damaging or otherwise adversely affecting any of the circuit package 1108, including structures 1110 on the bottom side of the circuit package 1108, a sufficient amount of space or clearance may be required below the circuit package 1108. In some embodiments, the present disclosure pertaining to modular PCBs may be implemented to create a cavity 1112 within the modular PCB 1101 having desired cavity characteristics without adding manufacturing complexity, processes, or costs.

Recall that PCB module 1104 (also referred to as the top PCB module) and PCB module 1102 (also referred to as the bottom PCB module) need not be of the same surface area or completely overlap with each other. Thus, PCB module 1104 can have a smaller surface area and/or different shape than PCB module 1102. For example, PCB module 1104 may include a cutout in the middle and thus be a donut shape (from a top view). As another example, PCB module 1104 may have a "U" shape, "L" shape, or any other shape (from the perspective of a top view) that permits a cavity of desired depth and width to be formed by virtue of forming a modular PCB as described below.

Figure 12:
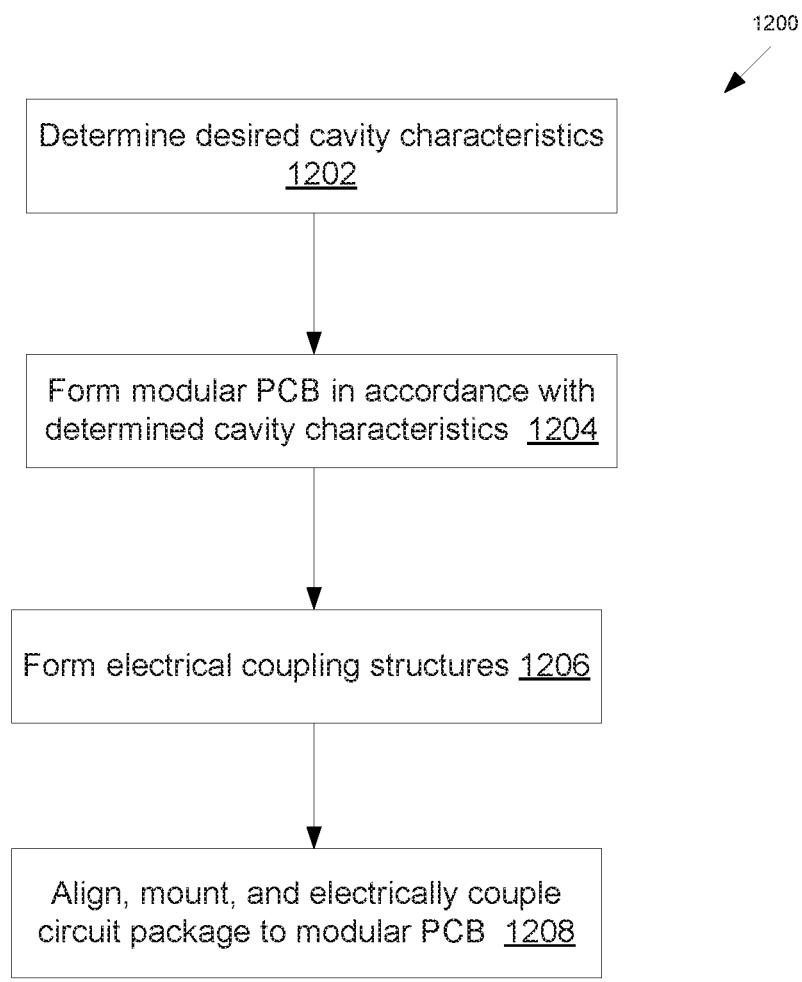
FIG. 12 depicts a flow diagram of an example process for producing the PCB structure of FIG. 11, according to some embodiments.

FIG. 12 depicts a flow diagram of an example process 1200 for producing the PCB structure 1100 of FIG. 11, according to some embodiments. In block 1202, desired cavity characteristics of cavity 1112 are determined. The dimensions and other requirements of the circuit package 1108 may dictate the cavity characteristics. For example, the height of the tallest structure from among the structures 1110 on the bottom side of the circuit package 1108 may provide the minimum cavity depth dimension. In some embodiments, structures relating to mounting the circuit package 1108 to the modular PCB 1101 may also factor into determination of the cavity characteristics. For instance, the height or thickness of attachment structures 1116, if not de minimis relative to the height or thickness of PCB module 1104 and middle layer 1106 may permit the cavity depth 1114 to be less than the height of the tallest structure from among the structures 1110. In other embodiments, other considerations such as cost, manufacturing efficiency, manufacturing tolerances, and the like may be taken into consideration in determination of the cavity characteristics.

In some embodiments, the bottom of cavity 1112 may be defined by PCB module 1102, and in particular, the top of PCB module 1102. One, two, or more sides of the cavity 1112 may be defined by PCB module 1104 and middle layer 1106. In an embodiment, a cavity depth 1114 of cavity 1112 may be defined by the combined height or thickness of PCB module 1104 and middle layer 1106. A particular cavity depth 1114 may be defined by manipulating the height or thickness of one or both of PCB module 1104 and middle layer 1106. PCB module 1102 need not be affected nor redesigned to create cavity 1112. At a minimum, cavity depth 1114 may be deep enough to provide the additional height required in addition to the height of attachment structures 1116 (e.g., solder balls or bumps) in order for the tallest structure of the structures 1110 to be unaffected after the circuit package 1108 is mounted to the modular PCB 1101.

In block 1204, modular PCB 1101 may be formed in accordance with the cavity characteristics determined in block 1202. In some embodiments, the process for fabricating the modular PCB 1101 maybe similar to the process described in FIG. 9. As an example, let's assume that the height or thickness of a middle layer is 4 mil and a top PCB module is 10 mil of a modular PCB made without taking into consideration cavity requirements. If in block 1204, it is determined that a minimum cavity depth of 16 mil is required, than the height/thickness of the middle layer and/or the top PCB module can be adjusted to provide a combined height/thickness of at least 16 mil. For example, a 6 mil thickness sheet of pre-preg material can be used instead of a 4 mil thickness sheet to create a middle layer 1106 that is 6 mil in thickness. Then the combined height/thickness of the middle layer 1106 and PCB module 1104 may be 16 mil, the minimum cavity depth. As another example, thicker board(s) and/or thicker layer(s) may be included in the PCB module 1104 to create a 12 mil thick PCB module 1104 instead of one that is 10 mil thick. Again, the combined height/thickness of a 4 mil middle layer and the 12 mil PCB module 1104 may result in a 16 mil thick combination, the minimum cavity depth. In yet another example, both the middle layer 1106 and PCB module 1104 thicknesses may be adjusted by using thicker materials in both to achieve the minimum cavity depth.

In some embodiments, additional layer(s) may be added to the middle layer 1106 or PCB module 1104 to achieve the desired cavity depth. In still other embodiments, factors such as, but not limited to, cost, manufacturing time, manufacturing complexity, manufacturing repeatability, manufacturing tolerances, impact on other performance characteristics, or any other factor may be taken into account in deciding how to achieve at least the minimum cavity depth by particular fabrication of the middle layer 1106 and/or PCB module 1104.

In block 1206, electrical coupling structure(s) may be formed in PCB module 1104, middle layer 1106, and/or PCB module 1102 in accordance with the particular electrical connection requirements of structures in the circuit package 1108 to modular PCB 1101. For example, if circuit package 1108 requires electrical coupling with one or more structures in PCB module 1102, than vias 1118 (e.g., plated through hole vias) may be formed that extend through PCB module 1104, middle layer 1106, and at least partially into PCB module 1106 and filled to form electrical couplings there between. In FIG. 11, attachment structures 1116 may facilitate electrical coupling between circuit package 1108 and modular PCB 1101. Alternatively, attachment structures 1116 may not be involved in providing electrical coupling. In other embodiments, electrical couplings between the circuit package 1108 and one or more of the PCB module 1104, middle layer 1106, and/or PCB module 1102 may not be present. Instead, the circuit package 1108 and one or more of the PCB module 1104, middle layer 1106, and/or PCB module 1102 may be bonded together for cost saving purposes, mechanical strength purposes, mechanical advantage reasons, thermal dissipation purposes, business reasons, or other purposes.

Next in block 1208, the circuit package 1108 may be aligned, mechanically mounted, and electrically coupled to the modular PCB 1101. Although not shown, one or more alignment and/or positioning mechanisms may be used to properly align the circuit package 1108 to modular PCB 1101. Additionally, processes such as curing, compression, etching, filling, photo imaging, and/or other processes may be performed to secure the circuit package 1108 and complete electrical coupling with the modular PCB 1101.

In this manner, designers have flexibility in cavity design without requiring redesign and/or limiting performance of one or more parts comprising modular PCBs. For instance, a cavity need not be milled or etched into a fabricated PCB or a certain amount of space allocated within the PCB for a cavity. Instead, cavity depth tolerance can be a function of the top PCB module and/or middle layer of a modular PCB. Because modular PCBs decouple design constraints inherent in a single PCB design, for example, each PCB module of a modular PCB may be separately designed and fabricated, characteristics (e.g., height) of each PCB module (as well as the middle layer that serves as the "conduit" between a top and bottom PCB module) may be separately controlled and adjusted, as necessary, to create cavities of specific depth in the combination.

Figure 13:
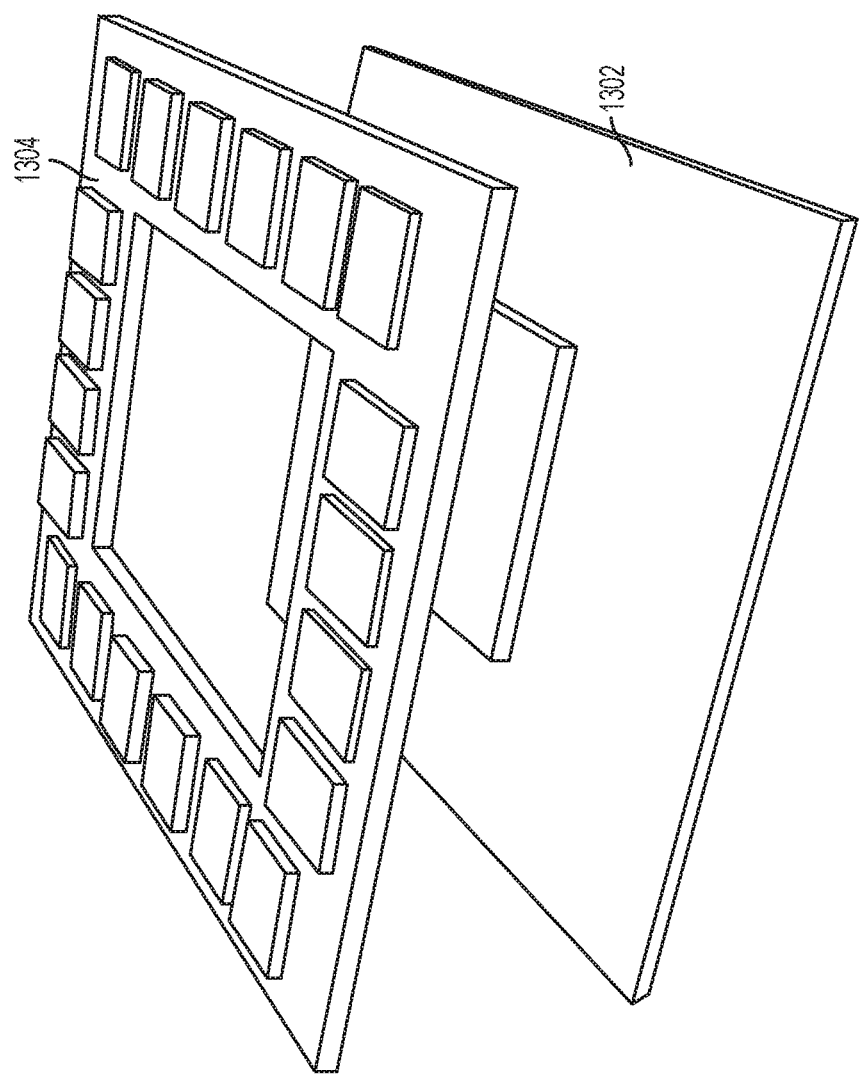
FIG. 13 depicts a perspective view of a modular PCB to which a circuit package may be mounted on an as-needed basis, according to some embodiments.

In some embodiments, modular PCBs may facilitate just-in-time inventory management. FIG. 13 depicts a perspective view of a circuit package 1302 to which a circuit package 1304 may be mounted on an as-needed basis, according to some embodiments. Circuit package 1304 may comprise, for example, a memory chipset or a memory ring of various memory size. Circuit package 1302 may comprise a PCB module that includes a CPU or PCH, which, in turn, may be mounted to a motherboard using, for example, socket or direct soldering. Circuit package 1302 includes the necessary electrical coupling structures to connect to circuit package 1304. After circuit package 1302 is completely fabricated, circuit package 1304 may not be mounted and electrically coupled to it until a customer order is received that specifies the amount of memory desired in the ordered computer that includes the circuit package 1302 (e.g., 4 GB, 8 GB, etc. of RAM memory). In response, the manufacturer may add a circuit package 1304 of the requested memory size on the circuit package 1302 just in time for shipment of the computer. In this manner, possibly undesirable combinations of CPUs and memory size are not created. And because adding circuit package 1304 to circuit package 1302 requires minimal effort and time, shipment of the computer is not unduly delayed.

In some embodiments, one or more of structure 800, structure 1100, or the structure of FIG. 13 may be included in a computing device such as, but not limited to, computers, laptops, smartphones, tablets, Internet of Things type devices, wearable devices, servers, workstations, mobile devices, and a variety of other computing devices. Structure 800, structure 1100, or the structure of FIG. 13 may include on PCB modules, one or more of each of a memory module, an input/output module, a graphics module, a processor module, a CPU, a routing module, a bus module, a transmitter module, a receiver module, or a controller module.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Illustrative examples of the devices, systems, and methods of various embodiments disclosed herein are provided below. An embodiment of the devices, systems, and methods may include any one or more, and any combination of, the examples described below.

Example 1 is a printed circuit board (PCB) structure, which may include a first PCB module including first structures on one or more layers of the first PCB module; a second PCB module including second structures on one or more layers of the second PCB module; and a middle layer, between the first PCB module and the second PCB module, electrically coupling, without connectors, one or more of the first structures aligned with one or more of the second structures.

Example 2 may include the subject matter of Example 1, and may further include the middle layer including a first valley filler layer, a second valley filler layer, and a bonding layer between the first valley filler layer and the second valley filler layer.

Example 3 may include the subject matter of any of Examples 1-2, and may further include the bonding layer is to at least partially secure the first PCB module to the second PCB module, and comprises pre-impregnated fiberglass and resin.

Example 4 may include the subject matter of any of Examples 1-3, and may further include the first valley filler layer comprises a non-conductive material or a photoimageable solder mask.

Example 5 may include the subject matter of any of Examples 1-4, and may further include the first valley filler layer is between the bonding layer and the first PCB module, the second valley filler layer is between the bonding layer and the second PCB module, one or more of the first structures of the first PCB module adjacent to the first valley filler layer comprises a plurality of first via pads, and one or more of the second structures of the second PCB module adjacent to the second valley filler layer comprises a plurality of second via pads, wherein the first PCB module is electrically coupled to the second PCB module using a plurality of vias included in the middle layer, and wherein each via pad of the plurality of first via pads is coupled to a respective via pad of the plurality of second via pads.

Example 6 may include the subject matter of any of Examples 1-5, and may further include the first valley filler layer is coplanar with the plurality of first via pads.

Example 7 may include the subject matter of any of Examples 1-6, and may further include a top of the first valley filler layer is the same or substantially the same height as a top of the plurality of first via pads.

Example 8 may include the subject matter of any of Examples 1-7, and may further include the first valley filler layer reduces electrical coupling between adjacent first structures that are conductive.

Example 9 may include the subject matter of any of Examples 1-8, and may further include each via of the plurality of vias is filled with a via filler, each via pad of the plurality of first via pads is electrically coupled to a respective via pad of the plurality of second via pads using a respective via filler, and wherein the first valley filler layer is to reduce each via filler from leaking out of the respective via of the plurality of vias.

Example 10 may include the subject matter of any of Examples 1-9, and may further include each via of the plurality of vias is filled with a via filler, each via pad of the plurality of first via pads is electrically coupled to a respective via pad of the plurality of second via pads using a respective via filler, and wherein the first valley filler layer reduces compression of the via filler in a respective plurality of vias.

Example 11 may include the subject matter of any of Examples 1-10, and may further include the first valley filler layer and the second valley filler layer is to prevent gaps between the first PCB module, the bonding layer, and the second PCB module.

Example 12 may include the subject matter of any of Examples 1-11, and may further include a surface of the first PCB module closest to the middle layer is an uneven surface, and wherein the first valley filler layer is to even out the surface.

Example 13 may include the subject matter of any of Examples 1-12, and may further include the surface comprises at least two different heights of one or more first structures of the first PCB module.

Example 14 may include the subject matter of any of Examples 1-13, and may further include wherein the first PCB module comprises one or more of a processor module, a memory module, an input/output module, a video module, a graphics module, a routing module, a bus module, a transmitter module, a receiver module, a controller module, or a baseboard management controller module, and wherein the second PCB module comprises a module different from the first PCB module.

Example 15 may include the subject matter of any of Examples 1-14, and may further include the second PCB module is replaced with a other PCB module from among a plurality of other PCB modules without changing the first PCB module, wherein each of the other PCB module of the plurality of other PCB modules is different from the second PCB module and the other PCB module includes other structures on one or more layers of the other PCB module, and wherein the middle layer, between the first PCB module and the other PCB module, electrically couples, without connectors, one or more of the first structures aligned with one or more of the other structures and electrically isolates one or more of the first structures from adjacent structures.

Example 16 may include the subject matter of any of Examples 1-15, and may further include a cavity is defined by the first PCB module, the middle layer, and the second PCB module, wherein the middle layer and the second PCB module comprise at least one side of the cavity.

Example 17 may include the subject matter of any of Examples 1-16, and may further include a thickness of the middle layer is defined in accordance with a cavity depth of the cavity to be formed by the first PCB module, the middle layer, and the second PCB module.

Example 18 may include the subject matter of any of Examples 1-17, and may further include the thickness of the middle layer is defined based on a thickness of the bonding layer.

Example 19 may include the subject matter of any of Examples 1-18, and may further include a thickness of the second PCB module is defined in accordance with a cavity depth of the cavity to be formed by the first PCB module, the middle layer, and the second PCB module.

Example 20 may include the subject matter of any of Examples 1-19, and may further include a circuit package over the second PCB module, wherein the circuit package includes one or more third structures protruding from a side of the circuit package closest to the second PCB module, and wherein the one or more third structures are within the cavity without touching any other structures.

Example 21 may include the subject matter of any of Examples 1-20, and may further include the cavity depth is selected in accordance with a tallest height of the one or more third structures.

Example 22 may include the subject matter of any of Examples 1-21, and may further include the circuit package is secured to the second PCB module and electrically coupled to at least one of the one or more first structures or the one or more second structures.

Example 23 is a method, which may include forming a first valley filler layer on a first side of a first printed circuit board (PCB) module including first structures on one or more layers; forming a second valley filler layer on a second side of a second PCB module including second structures on one or more layers; forming a bonding layer over the first PCB module; forming one or more electrical coupling structures within the bonding layer to electrically couple one or more of the first structures aligned with one or more of the second structures; and bonding and electrically coupling the first PCB module to the second PCB module.

Example 24 may include the subject matter of Example 23, and may further include forming the one or more electrical coupling structures within the bonding layer comprises forming one or more vias through the bonding layer in alignment with respective via pads included in the one or more first structures on the first side of the first PCB module; and forming a via filler in each of the one or more vias in the bonding layer, wherein the via filler comprises a conductive material.

Example 25 may include the subject matter of any of Examples 23-24, and may further include the bonding layer comprises a pre-impregnated fiberglass and resin compound, and the first valley filler layer comprises a non-conductive material or a photo-imageable solder mask.

Example 26 may include the subject matter of any of Examples 23-25, and may further include forming the first valley filler layer comprises forming the first valley filler layer in between one or more of the first structures exposed on the first side of the first PCB module.

Example 27 may include the subject matter of any of Examples 23-26, and may further include a thickness of the first valley filler layer is the same or substantially the same thickness as a thickest of the first structure exposed on the first side of the first PCB module.

Example 28 may include the subject matter of any of Examples 23-27, and may further include forming the bonding layer comprises forming the bonding layer over the first valley filler layer and one or more of the first structures exposed on the first side of the first PCB module.

Example 29 may include the subject matter of any of Examples 23-28, and may further include after forming one or more electrical coupling structures within the bonding layer, aligning and positioning the second side of the second PCB module with the second valley filler layer over the bonding layer, wherein aligning comprises aligning second via pads included in one or more of the second structures with respective one or more of the electrical coupling structures.

Example 30 may include the subject matter of any of Examples 23-29, and may further include bonding and electrically coupling the first PCB module to the second PCB module comprises curing and compressing a stack formed by the second PCB module with the second valley filler layer, the bonding layer, and the first PCB module with the first valley filler layer.

Example 31 may include the subject matter of any of Examples 23-30, and may further include forming the bonding layer over the first PCB module occurs before forming the one or more electrical coupling structures within the bonding layer.

Example 32 may include the subject matter of any of Examples 23-31, and may further include forming the one or more electrical coupling structures within the bonding layer occurs before forming the bonding layer over the first PCB module.

Example 33 may include the subject matter of any of Examples 23-32, and may further include determining one or more cavity characteristics associated with a cavity to be defined in accordance with a stack formed by the second PCB module with the second valley filler layer, the bonding layer, and the first PCB module with the first valley filler layer.

Example 34 may include the subject matter of any of Examples 23-33, and may further include the first PCB module comprises a bottom of the cavity, and the first valley filler layer, the bonding layer, the second valley filler layer, and the second PCB module comprise at least one side of the cavity.

Example 35 may include the subject matter of any of Examples 23-34, and may further include determining one or more cavity characteristics associated with the cavity comprises determining a cavity depth of the cavity, and wherein forming the bonding layer comprises forming the bonding layer at a particular thickness in accordance with the cavity depth of the cavity.

Example 36 may include the subject matter of any of Examples 23-35, and may further include determining one or more cavity characteristics associated with the cavity comprises determining a cavity depth of the cavity, and wherein the second PCB module is formed at a particular thickness in accordance with the cavity depth of the cavity.

Example 37 may include the subject matter of any of Examples 23-36, and may further include bonding and electrically coupling a circuit package to the stack, wherein the circuit package includes one or more third structures protruding from a side of the circuit package closest to the second PCB module, and wherein one or more of the third structures are within the cavity without touching any other structures.

Example 38 is a computing device, which may include a processor module included in a first printed circuit board (PCB), the first PCB including first structures on one or more layers; another computing module included in a second PCB, the second PCB including second structures on one or more layers; and a middle structure, between the first PCB and the second PCB, electrically coupling, without connectors, one or more of the first structures aligned with one or more of the second structures and electrically isolating one or more of the first structures from adjacent structures; wherein the another computing module is at least one of a memory module, an input/output module, a video module, a graphics module, a second processor module, a routing module, a bus module, a transmitter module, a receiver module, a controller module, or a baseboard management controller module, and wherein the middle structure includes a first valley filler layer, a second valley filler layer, and a bonding layer between the first valley filler layer and the second valley filler layer.

Example 39 may include the subject matter of Example 38, and may further include the bonding layer is to at least partially secure the first PCB to the second PCB, the bonding layer comprises pre-impregnated fiberglass and resin, and wherein the first valley filler layer comprises a non-conductive material or a photo-imageable solder mask.

Example 40 may include the subject matter of any of Examples 38-39, and may further include the first valley filler layer is between the bonding layer and the first PCB, the second valley filler layer is between the bonding layer and the second PCB, one or more of the first structures of the first PCB adjacent to the first valley filler layer comprises a plurality of first via pads, and one or more of the second structures of the second PCB adjacent to the second valley filler layer comprises a plurality of second via pads, wherein the first PCB is electrically coupled to the second PCB using a plurality of vias included in the middle structure, and wherein each via pad of the plurality of first via pads is coupled to a respective via pad of the plurality of second via pads.

Example 41 is a PCB, which may include a first PCB module with a first pattern of routing structures on one or more layers of the first PCB module; and a second PCB module with a second pattern of routing structures, on one or more layers of the second PCB module, aligned with and electrically coupled to the first pattern of routing structures without connectors.

Example 42 may include the subject matter of Example 41, and may further include a surface area of an outermost layer of the first PCB module is smaller than a surface area of an outermost layer of the second PCB module.

Example 43 may include the subject matter of Example 41 or 42, and may further include the first PCB module has higher signal routing density or higher power density than the second PCB module.

Example 44 may include any one of the subject matter of Examples 41-43, and may further include the first PCB module is configured to handle signal that operate below five gigahertz, and the second PCB module is configured to handle signal that operate at or above five gigahertz.

Example 45 may include any one of the subject matter of Examples 41-44, and may further include the first PCB module comprises a first PCB material with a first loss factor; and the second PCB module comprises a second PCB material with a second loss factor that is lower than the first loss factor.

Example 46 may include any one of the subject matter of Examples 41-45, and may further include a layer count of the first PCB module is greater than a layer count in the second PCB module.

Example 47 may include any one of the subject matter of Examples 41-46, and may further include the first PCB module is secured to the second PCB module based at least in part on a bonding layer having pre-impregnated fiberglass and resin.

Example 48 may include any one of the subject matter of Examples 41-47, and may further include the first PCB module is electrically coupled to the second PCB module based on a plurality of vias connecting the first pattern of routing structures to the second pattern of routing structures.

Example 49 may include any one of the subject matter of Examples 41-48, and may further include the first pattern of routing structures and the second pattern of routing structures share a common lamination via pattern.

Example 50 may include any one of the subject matter of Examples 41-49, and may further include the first pattern of routing structures comprises a plurality of first via pads, and the second pattern of routing structures comprises a plurality of second via pads, and wherein each via pad of the plurality of first via pads is coupled to a respective via pad of the plurality of second via pads.

Example 51 may include any one of the subject matter of Examples 41-50, and may further include at least one via that extends through the first PCB module and through the second PCB module.

Example 52 may include any one of the subject matter of Examples 41-51, and may further the PCB has at least two regions with different heights.

Example 53 may include any one of the subject matter of Examples 41-52, and may further include the first PCB module comprises a processor module and a memory module, and the second PCB module comprises an input/output module and a baseboard management controller.

Example 54 is a method for producing a modular PCB, which may include preparing a first pattern of routing structures on a layer of a first printed circuit board (PCB) module and a second pattern of routing structures on a layer of a second PCB module; and bonding the first PCB module and the second PCB module together based at least in part on pre-impregnated fiberglass and resin to electrically couple the second pattern of routing structures to the first pattern of routing structures without connectors.

Example 55 may include the subject matter of Example 54, and may include aligning the second pattern of routing structures with the first pattern of routing structures based at least in part on a registration hole.

Example 56 may include the subject matter of Example 54 or 55, and may further include drilling and plating at least one via going through the first PCB module and through the second PCB module.

Example 57 may include any one of the subject matter of Examples 54-56, and may further include drilling and plating at least one blind via, from the first PCB module and to be used only within the first PCB module, or from the second PCB module and to be used only within the second PCB module.

Example 58 may include any one of the subject matter of Examples 54-57, and may further include the first pattern of routing structures and the second pattern of routing structures share a common lamination via pattern.

Example 59 may include any one of the subject matter of Examples 54-58, and may further include the first PCB module comprises a processor module and a memory module, and the second PCB module comprises an input/output module and a baseboard management controller.

Example 60 is a computing device, which may include a processor module having a central processing unit and a memory secured to a first printed circuit board (PCB) substrate, the first PCB substrate including a first lamination via pattern defined on a bottom side; and an input/output module having a hardware controller secured to a second PCB substrate, the second PCB substrate including a second lamination via pattern defined on a top side; wherein the first lamination via pattern is secured to and electrically coupled with the second lamination via pattern without connectors.

Example 61 may include the subject matter of Example 60, and may further include the processor module further comprising at least one voltage regulator to provide a regulated voltage to the central processing unit or the memory.

Example 62 may include the subject matter of Example 60 or 61, and may further include the second lamination via pattern is arranged in a mirror image of the first lamination via pattern.

Example 63 may include any one of the subject matter of Examples 61-62, and may further include the first lamination via pattern comprises a plurality of first via pads and the second lamination via pattern comprises a plurality of second via pads, and wherein each via pad of the plurality of first via pads is coupled to a corresponding via pad of the plurality of second via pads.

Example 64 may include any one of the subject matter of Examples 61-63, and may further include the first PCB substrate comprises a first PCB material with a first loss factor; and the second PCB substrate comprises a second PCB material with a second loss factor that is lower than the first loss factor.

Example 65 may include any one of the subject matter of Examples 61-64, and may further include the hardware controller includes a baseboard management controller.

Example 66 is a printed circuit board (PCB) structure, which may include a first PCB module including first structures on one or more layers of the first PCB module; a second PCB module including second structures on one or more layers of the second PCB module; and a bonding means, between the first PCB module and the second PCB module, electrically coupling, without connectors, one or more of the first structures aligned with one or more of the second structures and bonding at least a portion of the first PCB module to the second PCB module.

Example 67 may include the subject matter of Example 66, and may further include a first valley filler layer between the first PCB module and the bonding means; and a second valley filler layer between the second PCB module and the bonding means.

Example 68 may include the subject matter of any of Examples 66-67, and may further include the bonding means is to at least partially secure the first PCB module to the second PCB module, and comprises pre-impregnated fiberglass and resin.

Example 69 may include the subject matter of any of Examples 66-68, and may further include the first valley filler layer comprises a non-conductive material or a photo-imageable solder mask.

Example 70 may include the subject matter of any of Examples 66-69, and may further include one or more of the first structures of the first PCB module adjacent to the first valley filler layer comprises a plurality of first via pads, and one or more of the second structures of the second PCB module adjacent to the second valley filler layer comprises a plurality of second via pads, wherein the first PCB module is electrically coupled to the second PCB module using a plurality of vias included in the bonding means, and wherein each via pad of the plurality of first via pads is coupled to a respective via pad of the plurality of second via pads.

Example 71 may include the subject matter of any of Examples 66-70, and may further include the first valley filler layer is coplanar with the plurality of first via pads.

Example 72 may include the subject matter of any of Examples 66-71, and may further include a top of the first valley filler layer is the same or substantially the same height as a top of the plurality of first via pads.

Example 73 may include the subject matter of any of Examples 66-72, and may further include the first valley filler layer reduces electrical coupling between adjacent first structures that are conductive.

Example 74 may include the subject matter of any of Examples 66-73, and may further include each via of the plurality of vias is filled with a via filler, each via pad of the plurality of first via pads is electrically coupled to a respective via pad of the plurality of second via pads using a respective via filler, and wherein the first valley filler layer is to reduce each via filler from leaking out of the respective via of the plurality of vias.

Example 75 may include the subject matter of any of Examples 66-74, and may further include each via of the plurality of vias is filled with a via filler, each via pad of the plurality of first via pads is electrically coupled to a respective via pad of the plurality of second via pads using a respective via filler, and wherein the first valley filler layer reduces compression of the via filler in a respective plurality of vias.

Example 76 may include the subject matter of any of Examples 66-75, and may further include the first valley filler layer and the second valley filler layer is to prevent gaps between the first PCB module, the bonding means, and the second PCB module.

Example 77 may include the subject matter of any of Examples 66-76, and may further include a surface of the first PCB module closest to the bonding means is an uneven surface, and wherein the first valley filler layer is to even out the surface.

Example 78 may include the subject matter of any of Examples 66-77, and may further include the surface comprises at least two different heights of one or more first structures of the first PCB module.

Example 79 may include the subject matter of any of Examples 66-78, and may further include a cavity is defined by the first PCB module, the bonding means, the first valley filler layer, the second valley filler layer, and the second PCB module.

Example 80 may include the subject matter of any of Examples 66-79, and may further include a thickness of at least one of the second PCB module or the bonding means is defined in accordance with a cavity depth of the cavity to be formed by the first PCB module, the bonding means, the first valley filler layer, the second valley filler layer, and the second PCB module.

Example 81 may include the subject matter of any of Examples 66-80, and may further include a circuit package over the second PCB module, wherein the circuit package includes one or more third structures protruding from a side of the circuit package closest to the second PCB module, and wherein the one or more third structures are within the cavity without touching any other structures.

Example 82 may include the subject matter of any of Examples 66-81, and may further include the cavity depth is selected in accordance with a tallest height of the one or more third structures.

Example 83 may include the subject matter of any of Examples 66-82, and may further include the circuit package is secured to the second PCB module and electrically coupled to at least one of the one or more first structures or the one or more second structures.

Example 84 may include the subject matter of any of Examples 66-83, and may further include the first PCB module comprises one or more of a processor module, a memory module, an input/output module, a video module, a graphics module, a routing module, a bus module, a transmitter module, a receiver module, a controller module, or a baseboard management controller module, and wherein the second PCB module comprises a module different from the first PCB module.

We claim:
1. A printed circuit board (PCB) structure comprising:
   a first PCB module including first structures on one or more layers of the first PCB module;
   a second PCB module including second structures on one or more layers of the second PCB module;
   a middle layer, between the first PCB module and the second PCB module, electrically coupling, without connectors, one or more of the first structures aligned with one or more of the second structures; and
   a circuit package over the second PCB module, wherein the circuit package includes one or more third structures protruding from a side of the circuit package closest to the second PCB module, wherein the one or more third structures are within a cavity, defined by the first PCB module, the middle layer, and the second PCB module, without touching any other structures, and wherein the middle layer and the second PCB module comprise at least one side of the cavity.

2. The PCB structure of claim 1, wherein the middle layer includes a first valley filler layer, a second valley filler layer, and a bonding layer between the first valley filler layer and the second valley filler layer.

3. The PCB structure of claim 2, wherein the bonding layer is to at least partially secure the first PCB module to the second PCB module, and comprises pre-impregnated fiberglass and resin.

4. The PCB structure of claim 2, wherein the first valley filler layer comprises a non-conductive material or a photo-imageable solder mask.

5. The PCB structure of claim 2, wherein the first valley filler layer is between the bonding layer and the first PCB module, the second valley filler layer is between the bonding layer and the second PCB module, one or more of the first structures of the first PCB module adjacent to the first valley filler layer comprises a plurality of first via pads, and one or more of the second structures of the second PCB module adjacent to the second valley filler layer comprises a plurality of second via pads, wherein the first PCB module is electrically coupled to the second PCB module using a plurality of vias included in the middle layer, and wherein each via pad of the plurality of first via pads is coupled to a respective via pad of the plurality of second via pads.

6. The PCB structure of claim 5, wherein the first valley filler layer is coplanar with the plurality of first via pads.

7. The PCB structure of claim 5, wherein a top of the first valley filler layer is the same or substantially the same height as a top of the plurality of first via pads.

8. The PCB structure of claim 5, wherein the first valley filler layer reduces electrical coupling between adjacent first structures that are conductive.

9. The PCB structure of claim 5, wherein each via of the plurality of vias is filled with a via filler, each via pad of the plurality of first via pads is electrically coupled to a respective via pad of the plurality of second via pads using a respective via filler, and wherein the first valley filler layer is to reduce each via filler from leaking out of a respective via of the plurality of vias.

10. The PCB structure of claim 5, wherein each via of the plurality of vias is filled with a via filler, each via pad of the plurality of first via pads is electrically coupled to a respective via pad of the plurality of second via pads using a respective via filler, and wherein the first valley filler layer reduces compression of the via filler in a respective plurality of vias.

11. The PCB structure of claim 1, wherein the first PCB module comprises one or more of a processor module, a memory module, an input/output module, a video module, a graphics module, a routing module, a bus module, a transmitter module, a receiver module, a controller module, or a baseboard management controller module, and wherein the second PCB module comprises a module different from the first PCB module.

12. The PCB structure of claim 1, wherein a thickness of the middle layer is defined in accordance with a cavity depth of the cavity to be formed by the first PCB module, the middle layer, and the second PCB module.

13. The PCB structure of claim 1, wherein a thickness of the second PCB module is defined in accordance with a cavity depth of the cavity to be formed by the first PCB module, the middle layer, and the second PCB module.

14. A method comprising:
   forming a first valley filler layer on a first side of a first printed circuit board (PCB) module including first structures on one or more layers;
   forming a second valley filler layer on a second side of a second PCB module including second structures on one or more layers;
   forming a bonding layer over the first PCB module;
   forming one or more electrical coupling structures within the bonding layer to electrically couple one or more of the first structures aligned with one or more of the second structures;
   bonding and electrically coupling the first PCB module to the second PCB module; and
   placing a circuit package over the second PCB module, wherein the circuit package includes one or more third structures protruding from a side of the circuit package closest to the second PCB module, wherein the one or more third structures are within a cavity, defined by the first PCB module, the bonding layer, and the second PCB module, without touching any other structures, and wherein the bonding layer and the second PCB module comprise at least one side of the cavity.

15. The method of claim 14, wherein forming the one or more electrical coupling structures within the bonding layer comprises:
   forming one or more vias through the bonding layer in alignment with respective via pads included in the one or more first structures on the first side of the first PCB module; and
   forming a via filler in each of the one or more vias in the bonding layer, wherein the via filler comprises a conductive material.

16. The method of claim 14, wherein forming the first valley filler layer comprises forming the first valley filler layer in between one or more of the first structures exposed on the first side of the first PCB module.

17. The method of claim 16, wherein forming the bonding layer comprises forming the bonding layer over the first valley filler layer and one or more of the first structures exposed on the first side of the first PCB module.

18. The method of claim 17, further comprising, after forming one or more electrical coupling structures within the bonding layer, aligning and positioning the second side of the second PCB module with the second valley filler layer over the bonding layer, wherein aligning comprises aligning second via pads included in one or more of the second structures with respective one or more of the electrical coupling structures.

19. The method of claim 18, wherein bonding and electrically coupling the first PCB module to the second PCB module comprises curing and compressing a stack formed by the second PCB module with the second valley filler layer, the bonding layer, and the first PCB module with the first valley filler layer.

20. The method of claim 14, further comprising determining one or more cavity characteristics associated with the cavity.

21. A computing device, comprising:
   a processor module included in a first printed circuit board (PCB), the first PCB including first structures on one or more layers;
   another computing module included in a second PCB, the second PCB including second structures on one or more layers;
   a middle structure, between the first PCB and the second PCB, electrically coupling, without connectors, one or more of the first structures aligned with one or more of the second structures and electrically isolating one or more of the first structures from adjacent structures; and
   a circuit package over the second PCB, wherein the circuit package includes one or more third structures protruding from a side of the circuit package closest to the second PCB, and wherein the one or more third structures are within a cavity without touching any other structures, the cavity defined by the first PCB, the middle structure, and the second PCB, and the middle structure and the second PCB comprise at least one side of the cavity;
   wherein the another computing module is at least one of a memory module, an input/output module, a video module, a graphics module, a second processor module, a routing module, a bus module, a transmitter module, a receiver module, a controller module, or a baseboard management controller module, and
   wherein the middle structure includes a first valley filler layer, a second valley filler layer, and a bonding layer between the first valley filler layer and the second valley filler layer.

22. The computing device of claim 21, wherein the first valley filler layer is between the bonding layer and the first PCB, the second valley filler layer is between the bonding layer and the second PCB, one or more of the first structures of the first PCB adjacent to the first valley filler layer comprises a plurality of first via pads, and one or more of the second structures of the second PCB adjacent to the second valley filler layer comprises a plurality of second via pads, wherein the first PCB is electrically coupled to the second PCB using a plurality of vias included in the middle structure, and wherein each via pad of the plurality of first via pads is coupled to a respective via pad of the plurality of second via pads.

23. A printed circuit board (PCB) structure comprising:
   a first PCB module including first structures on one or more layers of the first PCB module;
   a second PCB module including second structures on one or more layers of the second PCB module;
   a bonding means, between the first PCB module and the second PCB module, electrically coupling, without connectors, one or more of the first structures aligned with one or more of the second structures and bonding at least a portion of the first PCB module to the second PCB module, and a circuit package over the second PCB module, wherein the circuit package includes one or more third structures protruding from a side of the circuit package closest to the second PCB module, and wherein the one or more third structures are within a cavity without touching any other structures, the cavity being defined by the first PCB module, a middle structure, and the second PCB module, and the middle structure and the second PCB module comprising at least one side of the cavity.

24. The PCB structure of claim 23, further comprising:
a first valley filler layer between the first PCB module and the bonding means; and
a second valley filler layer between the second PCB module and the bonding means.

25. The PCB structure of claim 24, wherein one or more of the first structures of the first PCB module adjacent to the first valley filler layer comprises a plurality of first via pads, and one or more of the second structures of the second PCB module adjacent to the second valley filler layer comprises a plurality of second via pads, wherein the first PCB module is electrically coupled to the second PCB module using a plurality of vias included in the bonding means, and wherein each via pad of the plurality of first via pads is coupled to a respective via pad of the plurality of second via pads.

26. The PCB structure of claim 25, wherein a top of the first valley filler layer is the same or substantially the same height as a top of the plurality of first via pads.

27. The PCB structure of claim 23, wherein the first PCB module comprises one or more of a processor module, a memory module, an input/output module, a video module, a graphics module, a routing module, a bus module, a transmitter module, a receiver module, a controller module, or a baseboard management controller module, and wherein the second PCB module comprises a module different from the first PCB module.

28. The PCB structure of claim 1, wherein the middle layer includes at least a first portion comprising a first material and a second portion comprising a second material different from the first material; and wherein the first material comprises a photo-imageable solder mask and the second material comprises pre-impregnated fiberglass and resin.

29. The computing device of claim 21, wherein a bonding means includes at least a first portion comprising a first material and a second portion comprising a second material different from the first material; and wherein the first material comprises a photo-imageable solder mask and the second material comprises pre-impregnated fiberglass and resin.

30. The PCB structure of claim 1, wherein a thickness of the middle layer is defined in accordance with a cavity depth of the cavity.

31. The computing device of claim 21, wherein a thickness of the middle structure is defined in accordance with a cavity depth of the cavity.

32. The PCB structure of claim 1, wherein a thickness of the second PCB module is defined in accordance with a cavity depth of the cavity.

33. The computing device of claim 21, wherein a thickness of the second PCB module is defined in accordance with a cavity depth of the cavity.

34. The PCB structure of claim 1, wherein a cavity depth of the cavity is selected in accordance with a tallest height of the one or more third structures.

35. The computing device of claim 21, wherein a cavity depth of the cavity is selected in accordance with a tallest height of the one or more third structures.

* * * * *